US010839842B1

(12) United States Patent
Cao et al.

(10) Patent No.: US 10,839,842 B1
(45) Date of Patent: Nov. 17, 2020

(54) ATTENUATION OF VIBRATION-INDUCED DISTURBANCES IN A DATA STORAGE DEVICE

(71) Applicant: Seagate Technology LLC, Cupertino, CA (US)

(72) Inventors: WenJun Cao, Singapore (SG); Qiang Bi, Singapore (SG); Brent Jay Harmer, Longmont, CO (US); Kian Keong Ooi, Singapore (SG)

(73) Assignee: SEAGATE TECHNOLOGY LLC, Fremont, CA (US)

(*) Notice: Subject to any disclaimer, the term of this patent is extended or adjusted under 35 U.S.C. 154(b) by 0 days.

(21) Appl. No.: 16/803,416

(22) Filed: Feb. 27, 2020

(51) Int. Cl.
  G11B 20/10 (2006.01)
  G11B 7/125 (2012.01)
  G11B 5/596 (2006.01)
  H03L 7/093 (2006.01)

(52) U.S. Cl.
  CPC .......... *G11B 5/59627* (2013.01); *H03L 7/093* (2013.01)

(58) Field of Classification Search
  CPC .......... G11B 20/0013; G11B 20/10046; G11B 15/087; G11B 5/54; G11B 5/56; G11B 5/58; G11B 5/59633; G11B 5/59655; G11B 5/5543
  USPC ... 360/46, 65, 72.2, 78.11, 73.11, 75, 77.01, 360/77.05, 77.06, 77.08, 78.14
  See application file for complete search history.

(56) References Cited

U.S. PATENT DOCUMENTS

| | | |
|---|---|---|
| 6,504,668 B1 | 1/2003 | Takeuchi et al. |
| 6,580,579 B1 | 6/2003 | Hsin et al. |
| 6,636,376 B1 | 10/2003 | Ho |
| 6,762,902 B2 | 7/2004 | Chew |
| 6,768,607 B2 | 7/2004 | Ottesen et al. |
| 6,785,073 B2 | 8/2004 | Min et al. |
| 6,937,422 B2 | 8/2005 | Dang et al. |

(Continued)

FOREIGN PATENT DOCUMENTS

| | | |
|---|---|---|
| JP | 2006-155875 A | 6/2006 |
| KR | 100586764 B1 | 5/2004 |

OTHER PUBLICATIONS

Nie, Jianbin, "Control Design and Implementation of Hard Disk Drive Servos", a dissertation submitted in partial satisfaction of the requirements for the degree of Doctor of Philosophy in Engineering—Mechanical Engineering in the Graduate Division of the University of California, Berkeley, Spring 2011, © 2011, 109 pages.

*Primary Examiner* — Nabil Z Hindi
(74) *Attorney, Agent, or Firm* — Westman, Champlin & Koehler, P.A.

(57) ABSTRACT

A data storage drive includes a servo loop for positioning a head over a disc. The servo loop includes a sensor, located in the head, that senses servo information located on the disc and produces a servo signal therefrom. The servo signal is combined with a reference signal to produce a raw position error signal (PES). The servo loop further also at least one phase-matching disturbance attenuation (PMDA) filter that receives the raw PES as an input and responsively outputs a vibration-cancellation signal, which, when combined with the raw PES, cancels vibration-induced disturbance from the raw PES, thereby producing a refined PES. A servo controller receives the refined PES and responsively produces a servo control signal. An actuator moves the head in response to receiving the servo control signal.

20 Claims, 22 Drawing Sheets

(56) References Cited

U.S. PATENT DOCUMENTS

| | | | |
|---|---|---|---|
| 7,035,037 B2 | 4/2006 | Tao et al. | |
| 7,315,433 B2 | 1/2008 | Baek et al. | |
| 7,319,570 B2 | 1/2008 | Jia et al. | |
| 7,330,331 B2 | 2/2008 | Zhang | |
| 7,480,112 B2 * | 1/2009 | Tanner | G11B 19/042 360/31 |
| 7,596,795 B2 | 9/2009 | Ding et al. | |
| 8,027,119 B2 | 9/2011 | Zhang | |
| 8,619,361 B2 | 12/2013 | Hsin et al. | |
| 9,691,420 B2 | 6/2017 | Matsuzawa | |
| 2002/0093754 A1 | 7/2002 | Zhang et al. | |
| 2004/0090698 A1 | 5/2004 | Dang et al. | |
| 2006/0114602 A1 | 6/2006 | Baek et al. | |
| 2013/0194691 A1 | 8/2013 | Hara et al. | |

* cited by examiner

ATTENUATION OF VIBRATION-INDUCED DISTURBANCES IN A DATA STORAGE DEVICE

SUMMARY

In one embodiment, a data storage drive includes a servo loop for positioning a head over a disc. The servo loop includes a sensor, located in the head, that senses servo information located on the disc and produces a servo signal therefrom. The servo signal is combined with a reference signal to produce a raw position error signal (PES). The servo loop further also at least one phase-matching disturbance attenuation (PMDA) filter that receives the raw PES as an input and responsively outputs a vibration-cancellation signal, which, when combined with the raw PES, cancels vibration-induced disturbance from the raw PES, thereby producing a refined PES. A servo controller receives the refined PES and responsively produces a servo control signal. An actuator moves the head in response to receiving the servo control signal.

In another embodiment, an apparatus includes a servo loop. The apparatus further includes at least one PMDA filter in the servo loop. The PMDA filter is configured to produce a vibration-cancellation signal that cancels vibration-induced disturbance in a raw PES.

In yet another embodiment, a method carried out in a servo loop for positioning a head over a disc is provided. The method includes sensing, by the head, servo information located on the disc and producing a servo signal therefrom. The servo signal is combined with a reference signal to produce a raw PES. The method also includes employing at least one PMDA filter to produce a vibration-cancellation signal that cancels vibration-induced disturbance present in the raw PES.

This summary is not intended to describe each disclosed embodiment or every implementation of the system for attenuating vibration-induced disturbances. Many other novel advantages, features, and relationships will become apparent as this description proceeds. The figures and the description that follow more particularly exemplify illustrative embodiments.

DETAILED DESCRIPTION OF ILLUSTRATIVE EMBODIMENTS

Embodiments of the disclosure provide a system and method for reducing vibration-induced disturbances in a data storage device (e.g., a hard disc drive (HDD) or a hybrid drive).

In a HDD, a head is positioned over a track on a disc to store and/or retrieve data. The HDD includes a servo control system that is designed to provide stable positional control in the presence of different types of disturbances which can adversely impact the ability of the HDD to access and follow a particular track. Such disturbances include externally generated vibrations which are applied to the HDD housing from the environment in which the HDD is mounted, and internally generated vibrations induced by movement of components within the HDD during operation. These disturbances, which result in head position errors and servo position error signals (PES), can be categorized as either repeatable or non-repeatable runout errors (RRO and NRRO, respectively), and are typically manifested as frequency components of the PES. RRO errors are repetitive in nature (usually over each disc revolution) whereas NRRO errors occur more or less randomly over time.

Mechanical components of the HDD have natural modes of vibration or resonant modes that if excited by an energy source will cause the component to physically move at the natural frequencies of oscillation for the component in question. In some applications (e.g., in data centers), a number of HDDs may be closely packed together in an enclosure, and the HDDs may be cooled by one or more fans in the enclosure. The closely-packed HDDs may be subject to fan harmonic disturbances, which may contribute to NRRO errors in the closely-packed HDDs.

Embodiments of the disclosure provide a HDD servo control system that includes at least one phase-matching disturbance attenuation (PMDA) filter, which is designed such that its phase response matches with a closed loop phase response of the HDD at its design frequency, and therefore disturbance compensation is substantially improved. Additionally, for frequency-varying disturbances such as disturbances induced from cabinet fan speed changes, and acoustic transmission disturbance, frequency detection using one or more peak frequency detection filters (PFDFs) is employed. The PFDF(s) track the disturbance frequencies, and adaptive PMDA (APMDA) filters are then applied to cancel the frequency-varying disturbances. Prior to describing the PDMA filters, APMDA filters and the PFDF in detail, a description of an illustrative operating environment is provided below.

Figure 1:
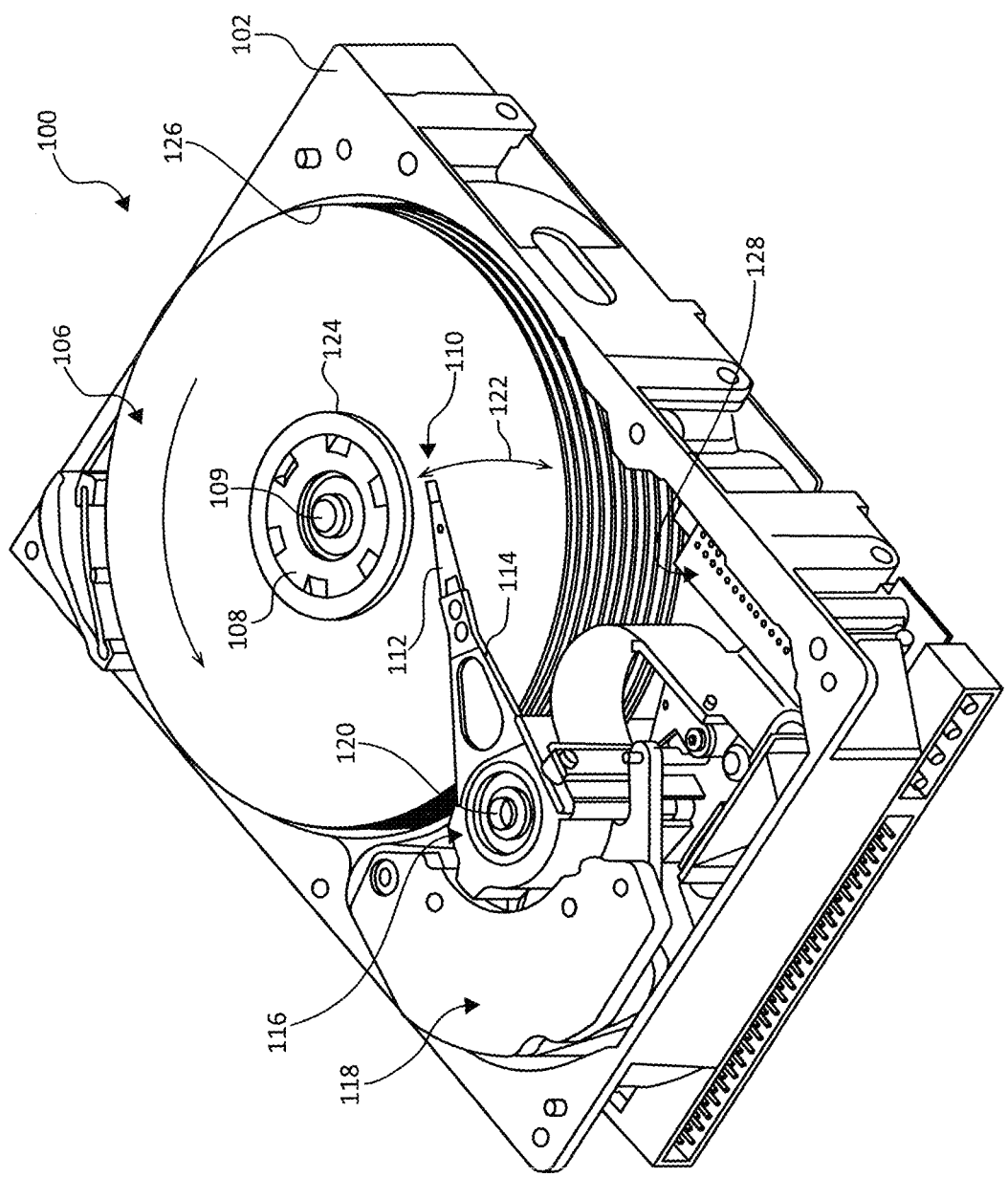
FIG. 1 illustrates an embodiment of a data storage device in which embodiments of the present application can be used.

FIG. 1 shows an illustrative operating environment in which certain embodiments disclosed herein may be incorporated. The operating environment shown in FIG. 1 is for illustration purposes only. Embodiments of the present disclosure are not limited to any particular operating environment such as the operating environment shown in FIG. 1. Embodiments of the present disclosure are illustratively practiced within any number of different types of operating environments.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

Referring now to FIG. 1, a perspective view of an example HDD 100 in which at least some of the present embodiments are useful is shown. HDD 100 includes a housing with a base 102 and a top cover (not shown). HDD 100 further includes a disc pack 106, which is mounted on a spindle motor (not shown) by a disc clamp 108. Disc pack 106 includes a plurality of individual discs which are mounted for co-rotation about central axis 109. It should be noted that, in some embodiments, a single disc instead of a plurality of discs may be used.

Each disc surface has an associated slider 110 which is mounted in HDD 100 and carries a read/write head for communication with the disc surface. In the example shown in FIG. 1, sliders 110 are supported by suspensions 112 which are in turn supported by track accessing arms 114 of an actuator 116. The actuator shown in FIG. 1 is of the type known as a rotary moving coil actuator and includes a voice coil motor (VCM), shown generally at 118. Other types of actuators can be used, such as linear actuators.

Voice coil motor 118 rotates actuator 116 with its attached sliders 110 about a pivot shaft 120 to position sliders 110 over a desired data track along a path 122 between a disc inner diameter 124 and a disc outer diameter 126. Voice coil motor 118 operates under the control of a closed-loop servo controller within internal circuitry 128 based on position information, which is stored on one or more of the disc surfaces within dedicated servo fields. The servo fields can be interleaved with data sectors on each disc surface or can be located on a single disc surface that is dedicated to storing servo information. As slider 110 passes over the servo fields, the read/write head generates a readback signal, which in turn is used to generate position error signals (PES) that identify the location of the head relative to the center line of the desired track. Based on the PES, actuator 116 moves suspension 112 to adjust the head's position so that it moves toward the desired position. Once the transducing head is appropriately positioned, servo controller 128 then executes a desired read or write operation.

Figure 2:
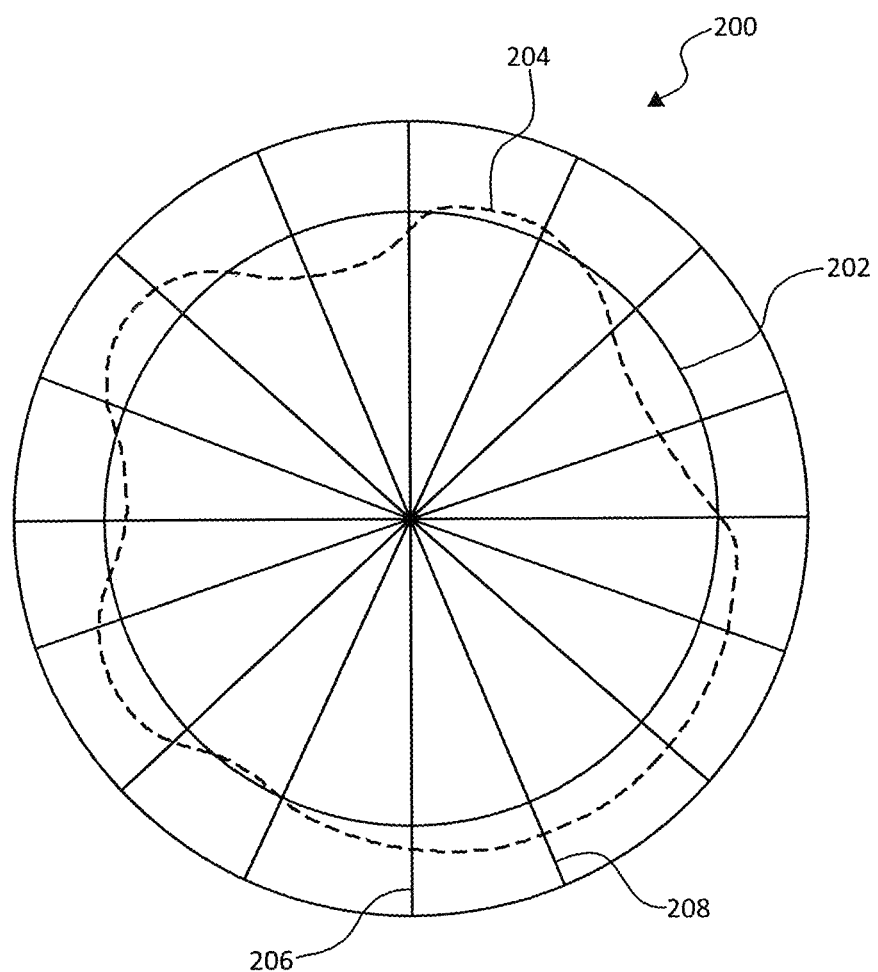
FIG. 2 is a top view of a disc pack of the data storage device of FIG. 1.

Referring now to FIG. 2, a top view of a disc of disc pack 106 (of FIG. 1) having a disc surface 200 with a circular track 202 is shown. Disc surface 200 includes a plurality of radially extending servo fields such as servo fields 206 and 208. The servo fields include servo information that identifies the location of track 202 on disc surface 200.

In one embodiment, any variation in the position of a head away from circular track 202 is considered a position error. Dashed line 204 illustrates an example path that the head could take in the presence of vibration-induced position errors, when the errors are left uncorrected. As noted earlier, disturbances that result in head position errors and servo PES are categorized as RRO and NRRO.

Figure 3:
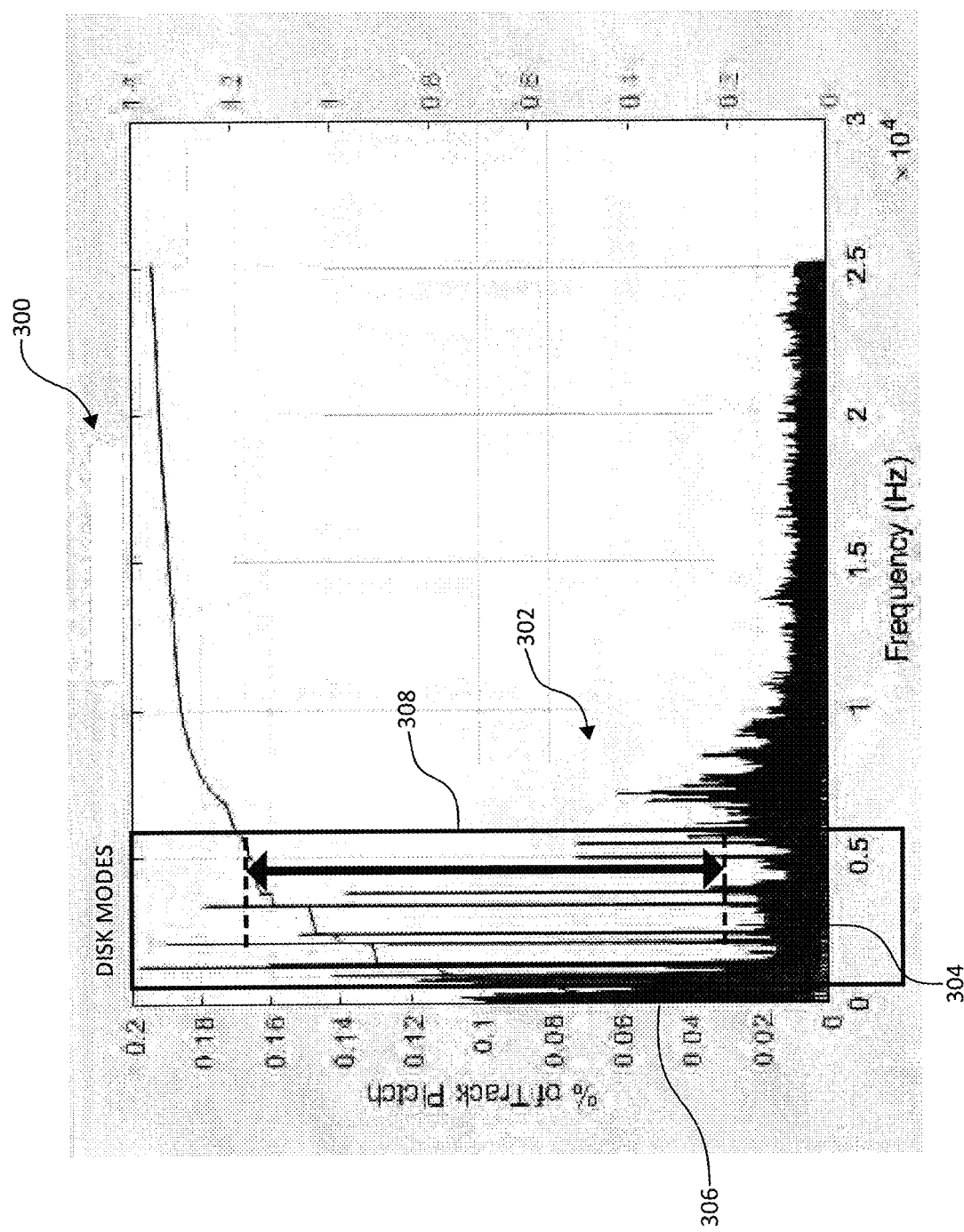
FIG. 3 is a graph that includes a plot of non-repeatable runout values in an example hard disc drive (HDD).

FIG. 3 is a graph 300 that includes a plot 302 of NRRO values in an example HDD. In graph 300, horizontal axis 304 represents frequency in Hertz (Hz) and vertical axis 306 represents percentage of track pitch. The portion of plot 302 within bock 308 represents NRRO from disc modes (referred to herein as disc mode NRRO), which, as can be seen in FIG. 3, is a large contributor to the total NRRO. Mechanical improvements may be made to achieve disc mode vibration reduction. However, such mechanical improvements are costly and may impact a product timeline. Further, traditional servo solutions (e.g., servo systems employing one or more notch filters to reduce an impact of vibration) tend to amplify NRRO at nearby frequencies (e.g., frequencies close to the notch filter design frequencies).

To address disc mode NRRO, embodiments of the disclosure employ one or more PMDA filters. Additionally, as noted above, for frequency-varying disturbances, frequency detection using one or more PFDFs is employed. The PFDFs track the disturbance frequencies and APMDA filters are applied to cancel the detected frequency-varying disturbances.

Figure 4:
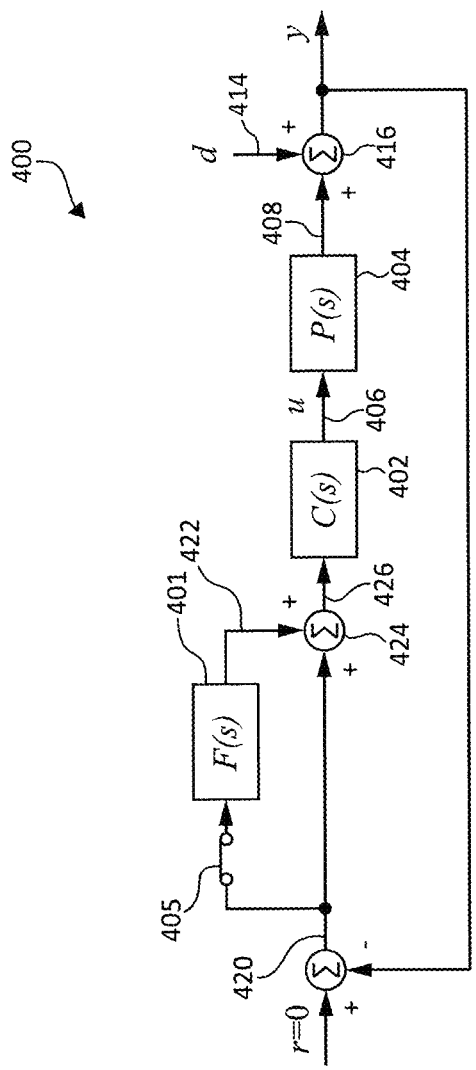
FIG. 4 is a simplified block diagram of a servo loop that may be employed in the data storage device of FIG. 1.

FIG. 4 is a simplified block diagram of a servo loop 400 of a disc drive such as 100 in which one or more PDMA filters (F(s)) 401 are employed. Servo loop 400 includes servo controller 402 represented by C(s) and a plant (e.g., disc drive actuator mechanics) 404 represented by P(s). Servo controller 402 may be a part of servo controller circuitry within internal circuit 128 of FIG. 1. Drive actuator mechanics 404 may include actuator assembly 116, voice coil motor 118, track accessing arm 114, suspension 112, and sliders 110, all of FIG. 1. In some embodiments, drive actuator mechanics may also include one or more microactuators (not shown) for fine positioning of sliders 110.

Servo controller 402 generates a servo control signal (e.g., a control current) u 406 that drives the voice coil motor of drive actuator 404. In embodiments that include a microactuator, the servo control signal 406 may include a control voltage that is supplied to the microactuator. In response to receiving the servo control signal 406, the drive actuator 404 produces head motion 408. Disturbances 414 are added to head motion 408 at summing node 416 to produce signal y.

Disturbances d at 414 are located at harmonic frequencies due to disc motion and other vibrations. When the head moves, servo fields on the disc may be read and therefore the head motion 408 or signal y include a servo signal or servo measurement signal indicative of a position/location of the head. The servo measurement signal is subtracted from a reference signal r, which may be generated by internal circuitry 128 based on a desired location of the head. Subtracting the servo measurement signal from reference signal r produces a raw PES 420. Raw PES 420 is provided to the PMDA filter(s) 401 that responsively output a vibration-cancellation signal 422. Vibration-cancellation signal 422 is provided to summing node 424 at which the raw PES 420 and the vibration-cancellation signal 422 are summed. The summing of signals 420 and 422 results in a refined PES 426, which is provided to servo controller 402. Upon receiving the refined PES 426, as indicated above, the servo controller 402 generates the servo control signal 406 that drives the voice coil motor of drive actuator 404. The removal of vibration by the one or more PMDA filters helps with accuracy of the servo control signal 406, thereby improving track following by a head (not shown in FIG. 4). A switch 405 of any suitable type may be included to turn the PMDA filters on and off as desired. An example PMDA filter F design to attenuate a single disc mode frequency $\omega_o$ is provided below. Continuous-time domain (s-domain) PMDA equations are first described, and thereafter an example of a discrete-time (z-domain) implementation of the PMDA is described.

To attenuate the disc mode at $\omega_o$, PMDA filter F is designed in the following form in a continuous-time domain:

$$F = -K \frac{s(s - \omega_0 \tan^{-1}\varphi)}{s^2 + 2\rho\omega_0 s + \omega_0^2} \qquad \text{Equation 1}$$

where $\varphi$ is a phase of a closed-loop response at the disc mode frequency $\omega_0$, K is an amplitude of the PMDA, p is the damping ratio, and $$\varphi = \angle T_0(j\omega_0), \; T_0 = \frac{PC}{1 + PC} \qquad \text{Equation 2}$$

where $T_0$ is a closed loop transfer function.
With PMDA filter F, a sensitivity function (S-function) may be separated into:
  a) An original S-function, which is expressed as $$S_0 = \frac{1}{1 + PC} \qquad \text{Equation 3}$$

b) A PMDA S-function, which is expressed as $$S_F = \frac{1}{1 + T_0 F} \qquad \text{Equation 4}$$

From Equations 3 and 5, the S-Function using the PMDA filter can be factorized into:

$$S = \frac{1}{1 + PC(1 + F)} = S_0 \cdot S_F \qquad \text{Equation 5}$$

As noted above, at disc mode frequency $\omega_0$, the closed-loop phase is $\varphi$, and $\angle T_0(j\omega_0) = \varphi$ from Equation 2.
The PMDA phase should be $-\varphi$ in order to cancel closed-loop phase $\varphi$, and therefore $$F(j\omega_0) = -K \frac{s(s - \omega_0 \tan^{-1}\varphi)}{s^2 + 2\rho\omega_0 s + \omega_0^2}\bigg|_{s=j\omega_0} = \qquad \text{Equation 6}$$

$$K \frac{\cos\varphi - j\sin\varphi}{2\rho\sin\varphi} = \frac{K}{2\rho\tan\varphi}(1 - j\tan\varphi)$$

$$\angle F(j\omega_0) = -\varphi \qquad \text{Equation 7}$$

At disc mode frequency $\omega_0$, PMDA filter F exactly cancels the phase of the closed-loop $T_0$, and therefore $$\angle T_0 F(j\omega_0) = 0 \qquad \text{Equation 8}$$

The behavior of PMDA filter F is described below with the help of Nyquist plots shown in FIGS. 5 and 6.

Figure 5:
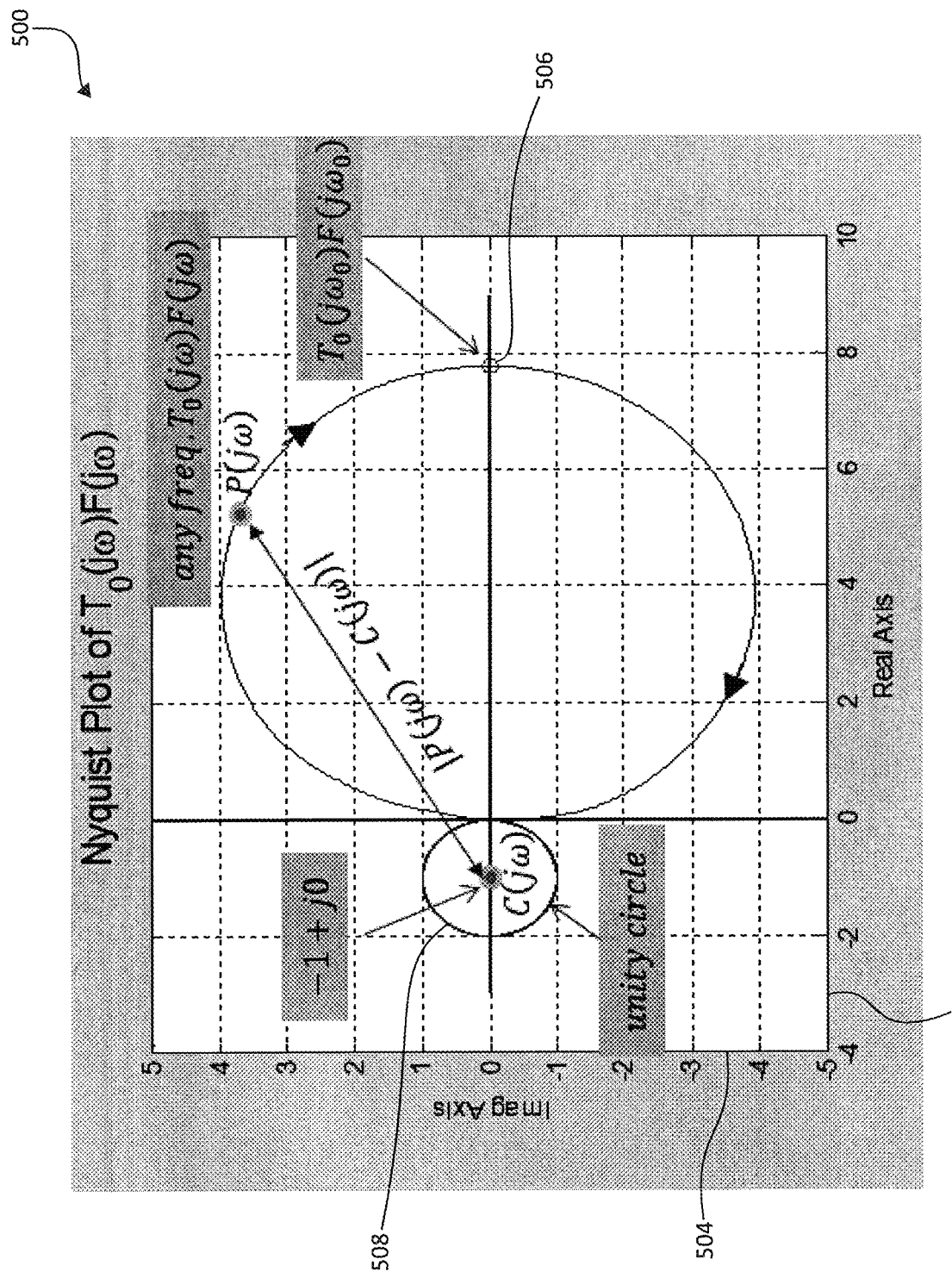
FIG. 5-8 are graphs showing different aspects of a phase-matching disturbance attenuation (PMDA) filter response.

FIG. 5 is graph including a Nyquist plot 500 of $T_0(j\omega)F(j\omega)$, which shows no amplification at frequencies near the disc mode frequency $\omega_0$. In FIG. 5, horizontal axis 502 is a real axis and vertical axis 504 is an imaginary axis. At $\omega_0$, $T_0F$ becomes a scalar with no imaginary part, and stays on the positive real-axis. This is shown at 506 of FIG. 5. In FIG. 5, the distance between $P(j\omega)$ and $C(j\omega)$ is:

$$|P(j\omega) - C(j\omega)| = |1 + T_0(j\omega)F(j\omega)| \qquad \text{Equation 9}$$

For the nearby frequencies $\omega$ around $\omega_0$, $T_0(j\omega)F(j\omega)$ stays out of unity circle 508, e.g., $|P(j\omega) - C(j\omega)| > 1$. Therefore, $|1 + T_0(j\omega)F(j\omega)| > 1$ and $$|S_F(j\omega)| = \left| \frac{1}{1 + T_0(j\omega)F(j\omega)} \right| < 1.$$

Figure 6:
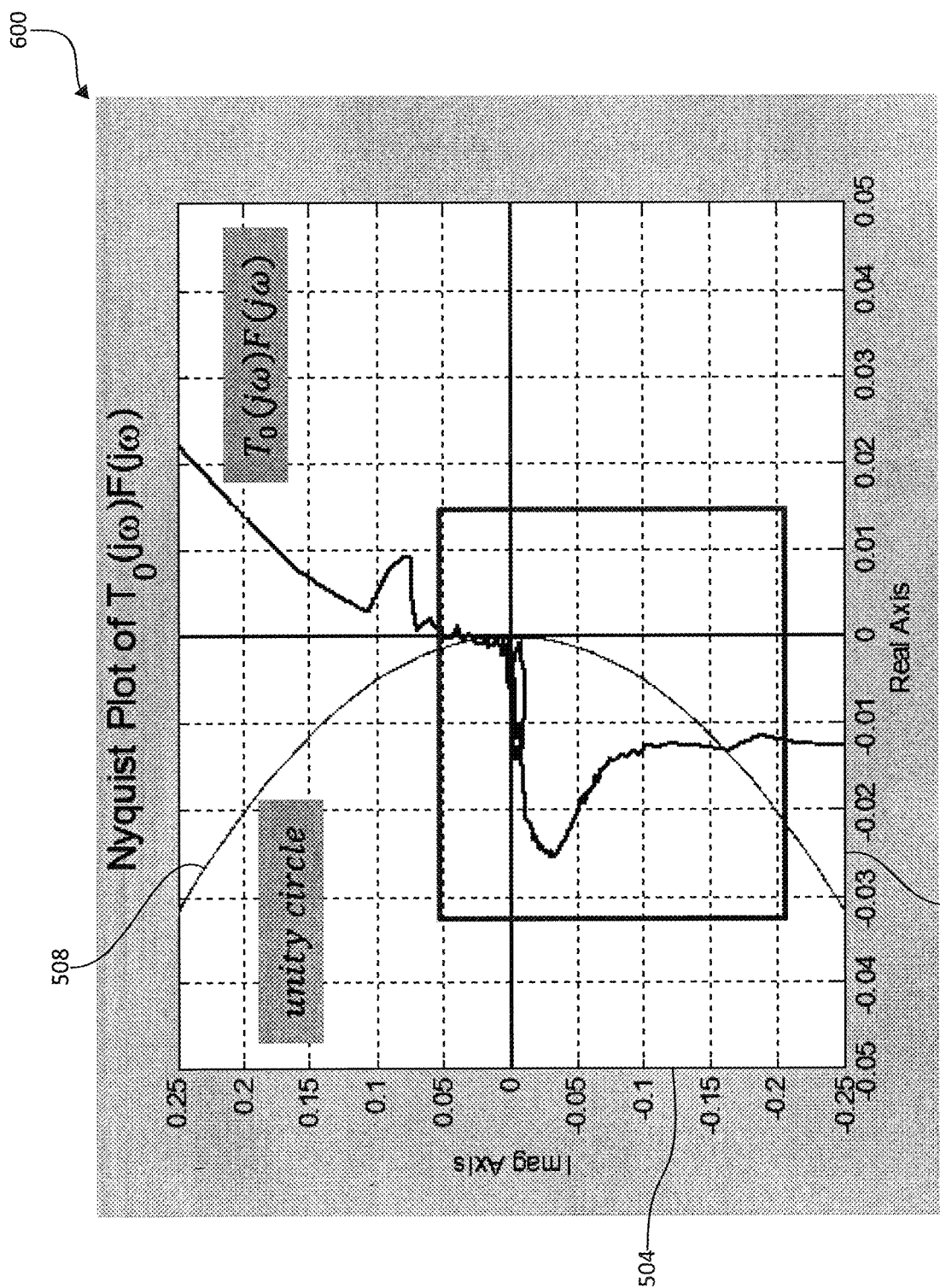

FIG. 6 is a zoomed-in portion 600 of the Nyquist plot of FIG. 5. From zoomed-in portion 600, it is seen that $T_0F(j\omega)$ enters into the unity-circle 508 at a frequency range that is far away from disc mode frequency $\omega_0$. At this frequency range, $T_0F(j\omega)$ enters unity-circle, e.g., $|1 + T_0^*F(j\omega)| < 1$ and causes amplification $$|S_F(j\omega)| = \left| \frac{1}{1 + T_0(j\omega)F(j\omega)} \right| > 1.$$

When a frequency response is reduced in one part of a spectrum, it may get larger in another part of the spectrum, which, for the PMDA filter, is undesirable. To address this, the Bode Integral Theorem is employed to determine a limit of the PMDA. From the Bode Integral Theorem, the original system $S_0$ without PMDA is limited by $$\int_0^F \ln|S_0(j\omega)|d\omega = C_0 \qquad \text{Equation 10}$$

The PMDA-compensated system S is also limited by $$\int_0^{F_S} \ln|S(j\omega)|d\omega = C \qquad \text{Equation 11}$$

From the principle of separation discussed above, $$S = S_0 \cdot S_F \quad \text{Equation 12}$$

Therefore, the PMDA S-function is also limited by the Bode Integral Theorem in the following manner:

$$\int_0^{F_S} \ln|S_F(j\omega)|d\omega = C - \int_0^{F_S} \ln|S_0(j\omega)|d\omega = C - C_0 \quad \text{Equationn 13}$$

Figure 7:
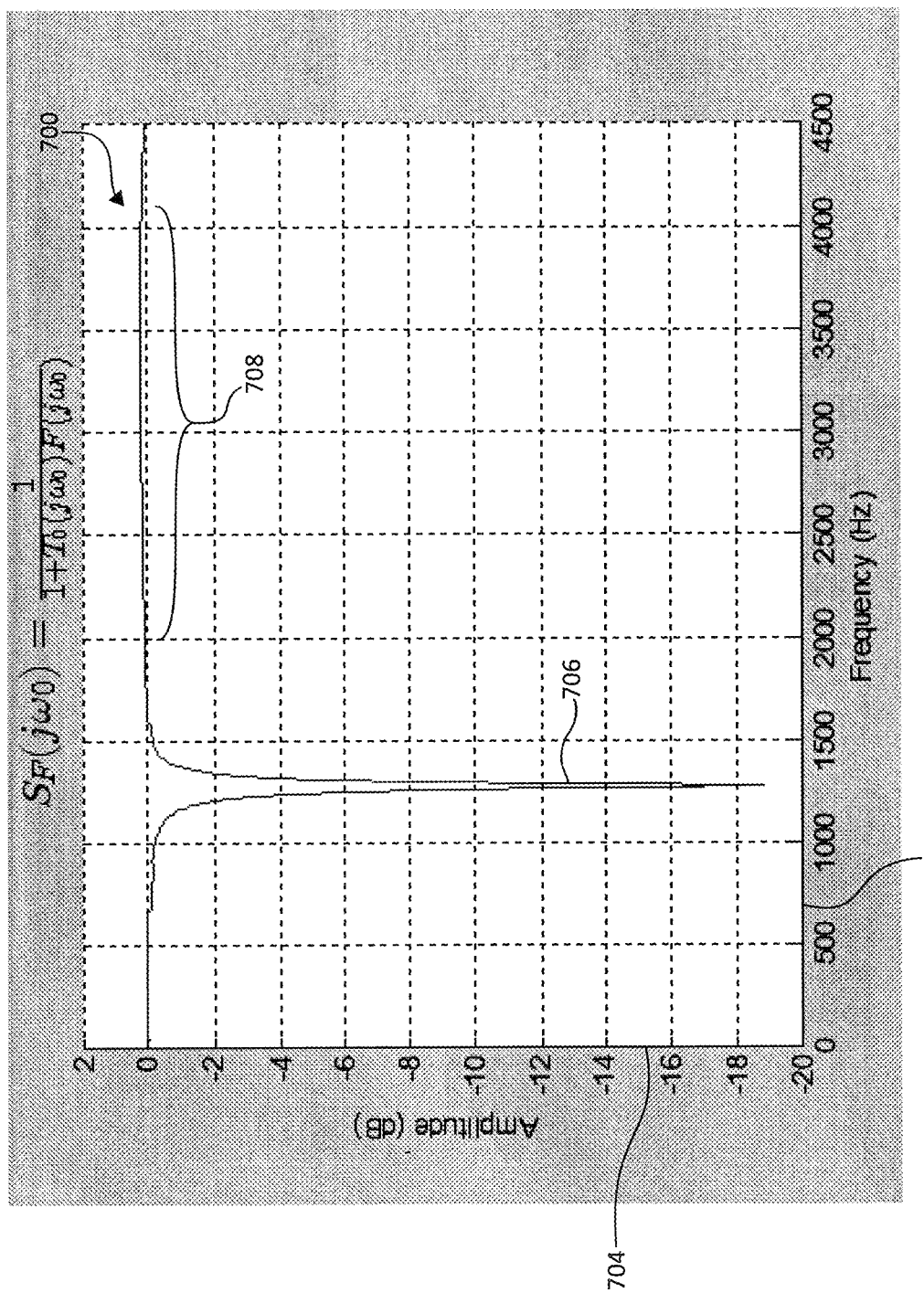
Figure 8:
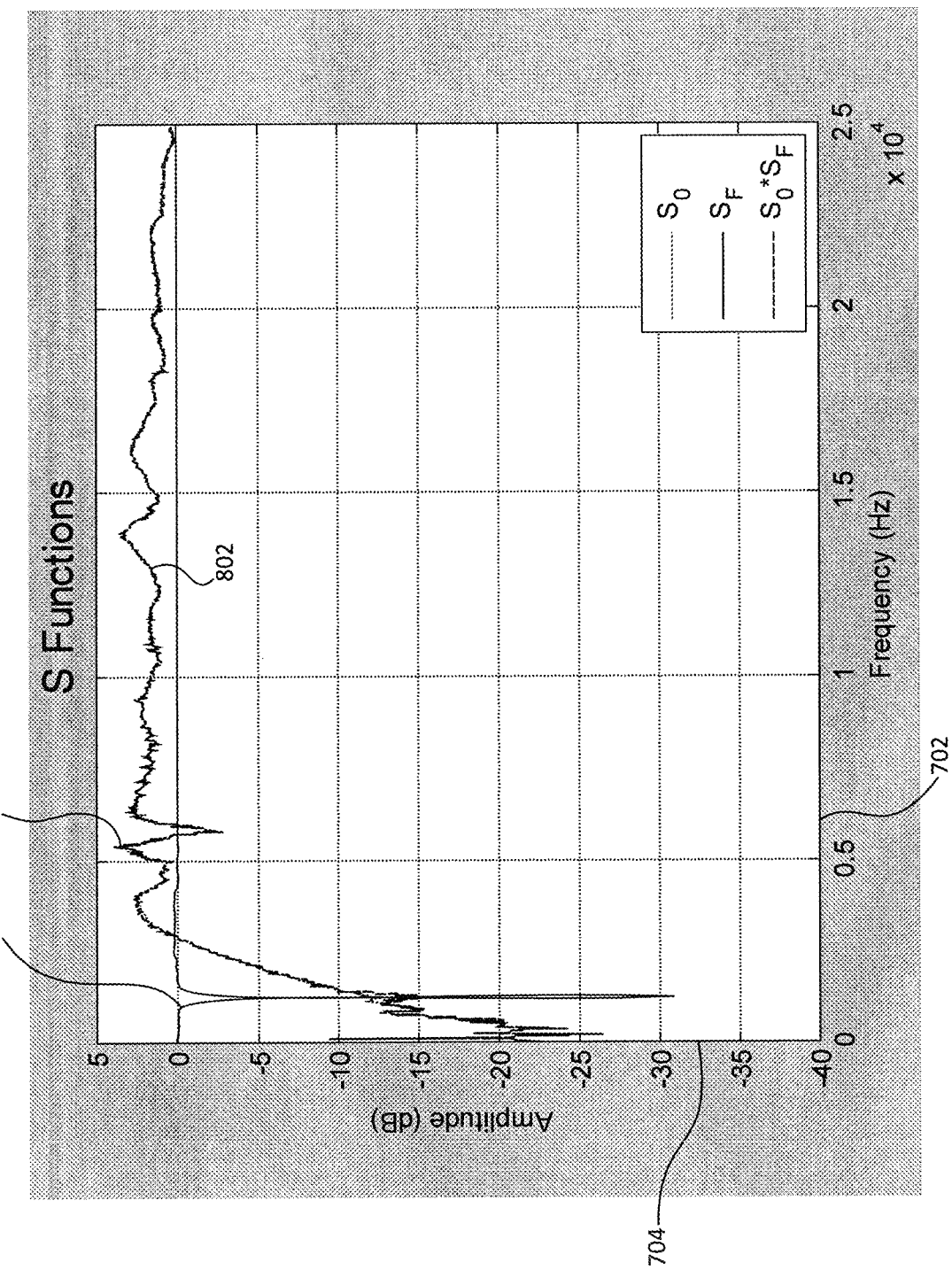

Results for the PMDA filter with its S-function limited by the Bode Integral Theorem are shown in FIGS. 7 and 8.

FIG. 7 is a graph including a plot 700 showing attenuation at $\omega_0$ obtained in an HDD employing a PMDA filter. In FIG. 7, horizontal axis 702 represents frequency in Hz and vertical axis 704 represents amplitude in decibels (dB). As can be seen in FIG. 7, the PDMA S-function produces a notch-like attenuation 706. The notch-like attenuation 706 is at about 1280 Hz. It is seen that the reduction/attenuation at 1280 Hz is mildly penalized by a slight amplification at a range 708 above 2000 Hz.

FIG. 8 is a graph showing overall and separated S-function plots, with the different plots showing attenuation at $\omega_0$. In FIG. 8, the overall S-function plot, $S=S_0 \cdot S_F$, is denoted reference numeral 802, and the separate plots $S_0$ and $S_F$ are denoted by reference numerals 804 and 806, respectively. In FIG. 8, it is seen that the PMDA filter applies a notch-like attenuation $S_F$ directly on the original S-function $S_0$. It is also seen that the PMDA filter achieves the target narrow-band disc mode attenuation with minimal amplification on nearby frequencies.

The above-described PMDA approach may be generalized for attenuation of multiple disc modes using multiple PMDA filters. In Equation 14 below, the PMDA filter is generalized into a series of N-length PMDA filters $$S = S_0 S_1 S_2 \ldots S_N = S_0 \prod_{j=1}^{N} S_j \quad \text{Equation 14}$$

The S-function of the j-th PMDA filter $F_j$ is $$S_j = \frac{1}{1 + T_0 F_j} \quad \text{Equation 15}$$

The Bode Integral Theorem for an individual PMDA filter S-function holds:

$$\int_0^{F_S} \ln|S_j(j\omega)|d\omega = C_j \quad \text{Equation 16}$$

$$j = 1, 2, \ldots, N$$

Applying Equation 16 to the N separate S-functions of Equation 14 provides a total S-function that is limited by.

$$\int_0^{F_S} \ln|S(j\omega)|d\omega = \quad \text{Equation 17}$$

$$\int_0^{F_S} \ln|S_0(j\omega)|d\omega + \sum_{j=1}^{n} \int_0^{F_S} \ln|S_j(j\omega)|d\omega = \sum_{j=0}^{N} C_j$$

Figure 9:
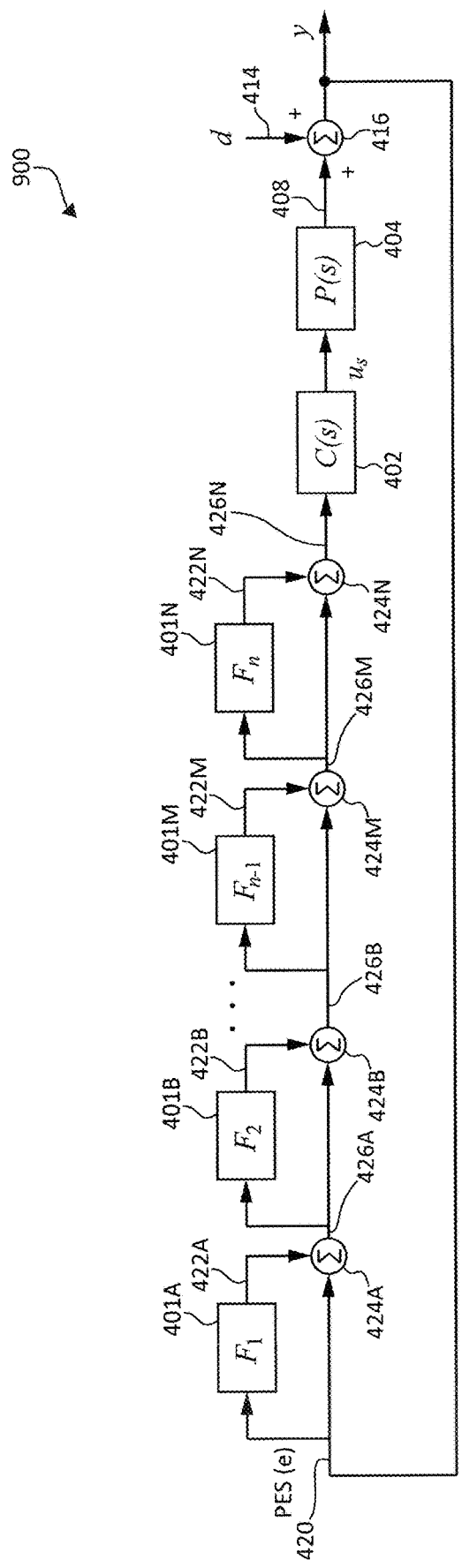
FIG. 9 is a simplified block diagram of a servo loop including multiple PMDA filters.

FIG. 9 illustrates a servo loop 900 that includes a plurality of PMDA filters 401A-401N, with each different one of the PMDA filters 401A-401N designed to attenuate a different frequency (e.g., a different disc mode frequency). For example, PMDA filter 401A is designed to attenuate a first frequency from a PES (e.g., raw PES 420) and to produce a first vibration-cancellation signal 422A, which is provided to summing node 424A at which the raw PES 420 and the first vibration-cancellation signal 422A are summed. The summing of signals 420 and 422A results in a first refined PES 426A. PMDA filter 401B is designed to attenuate a second frequency from the PES (e.g., first refined PES 426A) and to produce a second vibration-cancellation signal 422B, which is provided to summing node 424B at which the first refined PES 426A and the second vibration-cancellation signal 422B are summed. The summing of signals 426A and 422B results in a second refined PES 426B. A similar process is carried out in the remaining ones of the N filters.

Equations 1-17 described above are continuous-time domain (s-domain) PMDA equations. In embodiments of the disclosure, the PMDA filters are implemented as discrete-time filters. An example discrete-time (z-domain) implementation of a PMDA filter is described below.

In one embodiment, the continuous-time domain PMDA filter of Equation 1 is discretized using pole-zero mapping. The poles and zeros are:

$$\begin{cases} p_1 = -\rho\omega_0 + j\omega_0\sqrt{1-\rho^2} \\ p_2 = -\rho\omega_0 - j\omega_0\sqrt{1-\rho^2} \\ z_1 = 0 \\ z_2 = \omega_0 \tan^{-1}\varphi \end{cases} \quad \text{Equation 18}$$

where $p_1$ and $p_2$ are first and second poles, respectively, and $z_1$ and $z_2$ are respective first and second zeros.

The discrete-time domain PMDA filter is $$F(z) = K_z \frac{(z - e^{z_1 T_s})(z - e^{z_2 T_s})}{(z - e^{p_1 T_s})(z - e^{p_2 T_s})} \quad \text{Equation 19}$$

$$\begin{cases} e^{z_1 T_s} = 1 \\ e^{z_2 T_s} = e^{\omega_0 T_s \tan^{-1}\varphi} \\ e^{p_1 T_s} + e^{p_2 T_s} = -2e^{-\rho\omega_0 T_s}\cos(\omega_0 T_s \sqrt{1-\rho^2}) \\ z_2 = \omega_0 \tan^{-1}\varphi \\ e^{p_1 T_s} e^{p_2 T_s} = e^{-2\rho\omega_0 T_s} \end{cases}$$

where Ts is the servo sampling period.

The discrete-time PMDA filter can be simplified into $$F(z) = K_z \frac{z^2 - (1 + e^{\omega_0 T_s \tan^{-1}\varphi})z + e^{\omega_0 T_s \tan^{-1}\varphi}}{z^2 - 2e^{-\rho\omega_0 T_s}\cos(\omega_0 T_s \sqrt{1-\rho^2})z + e^{-2\rho\omega_0 T_s}} \quad \text{Equation 20}$$

The gain of the discrete-time PMDA filter is designed to match the continuous-time gain at the Nyquist frequency to obtain $$K_z = \frac{K}{2}\left[\frac{1 + 2e^{-\omega_0 T_s \rho}\cos(\omega_0 T_s \sqrt{1-\rho^2}) + e^{-2\omega_0 T_s \rho}}{1 + e^{\omega_0 T_s \tan^{-1}\varphi}}\right] \quad \text{Equation 21}$$

It should be noted that pole-zero mapping is one example discretization technique. In general, any suitable discretization technique may be utilized in different embodiments without departing from the scope of the disclosure.

Figure 10:
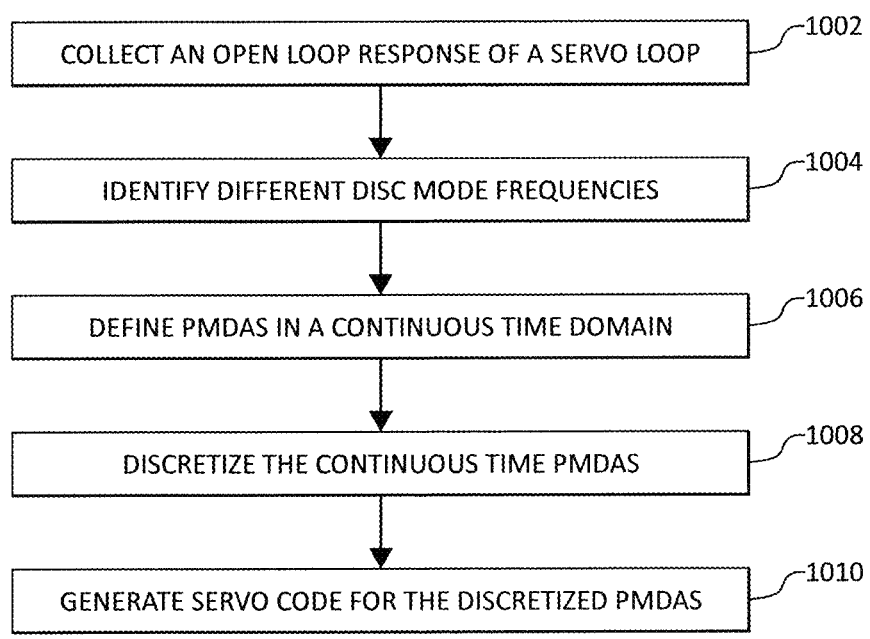
FIG. 10 is a flowchart of a method embodiment.

FIG. 10 is a flowchart of a method 1000 of implementing a PMDA filter in accordance with one embodiment. At 1002, an open loop response is collected for a servo loop such as servo loop 400 of FIG. 4. At 1004, different disc mode frequencies are identified. In one embodiment, the different disc mode frequencies may be identified by performing a Fast Fourier Transform on the PES. At 1006, a matrix $$\left(\text{e.g.,}\begin{bmatrix}\omega_1 & \cdots & \omega_n \\ K_1 & \cdots & K_n \\ \rho_1 & \cdots & \rho_n\end{bmatrix}\right)$$

for all N PMDAs to be used is defined in a continuous-time domain. At 1008, elements of the matrix are discretized. At 1010, servo code for the discretized elements is generated. The servo code is saved in any suitable memory in, for example, the HDD that includes the servo loop. When executed by a processor in the HDD, the servo code implements the PMDA filter(s).

Table 1 below includes vibration-attenuation results obtained by employing 10 PDMA filters in a HDD to damp 10 different disc mode frequencies observed in that HDD. The 10 PMDA filters were designed and implemented in accordance with the method of FIG. 10.

TABLE 1

| Frequency | 773 Hz | 818 H | 887 Hz | 998 Hz | 1280 Hz | 1393 Hz | 2105 Hz | 2410 Hz | 3375 Hz | 3787 Hz |
|---|---|---|---|---|---|---|---|---|---|---|
| Damping | 0.001 | 0.001 | 0.001 | 0.01 | 0.005 | 0.001 | 0.005 | 0.005 | 0.001 | 0.001 |
| Gain | 0.01 | 0.01 | 0.01 | 0.01 | 0.01 | 0.01 | 0.02 | 0.02 | 0.03 | 0.02 |

Figure 11:
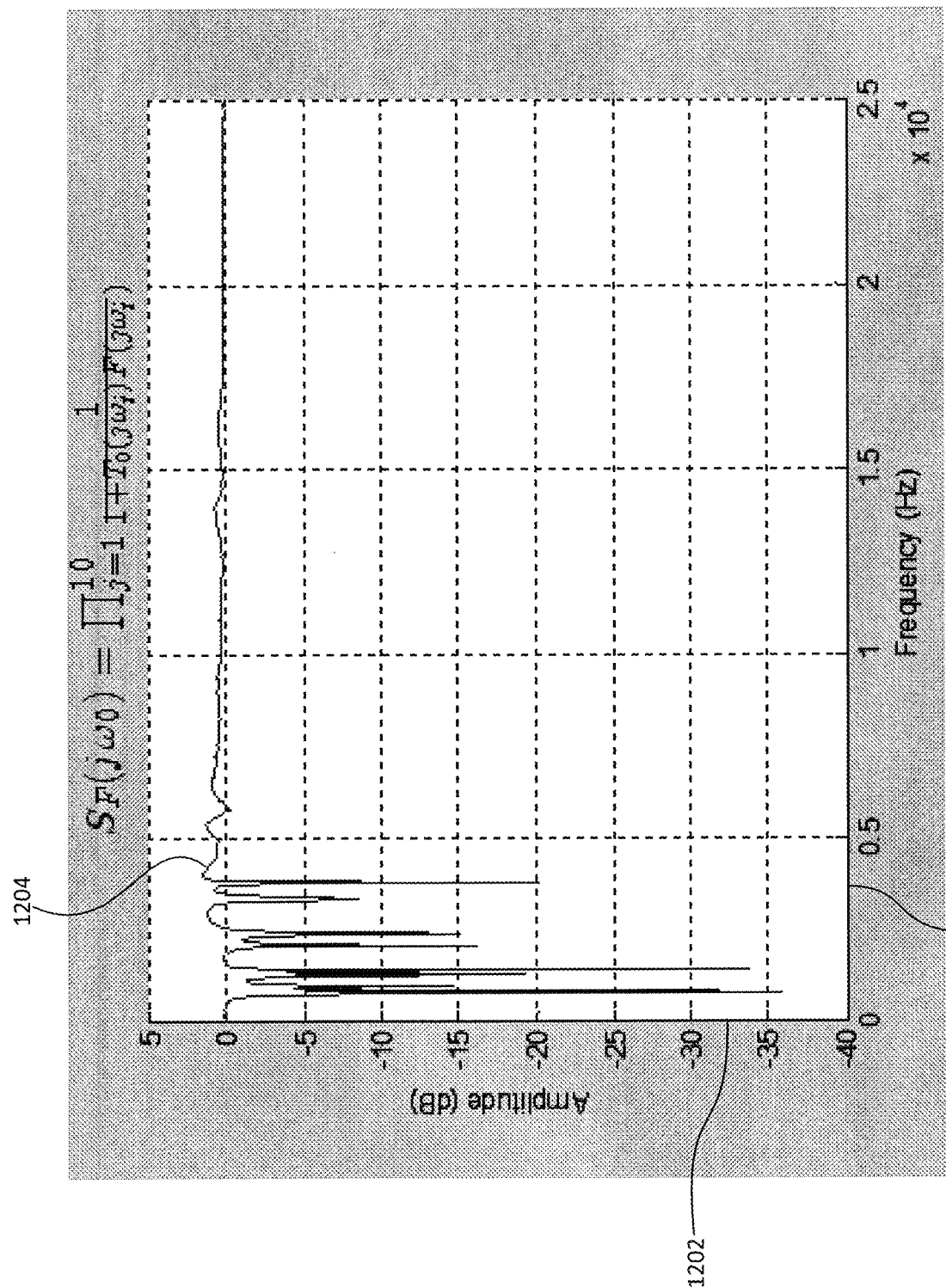
FIGS. 11-13 graphs showing vibration-damping results obtained by employing a PMDA filter in an HDD.
Figure 12:
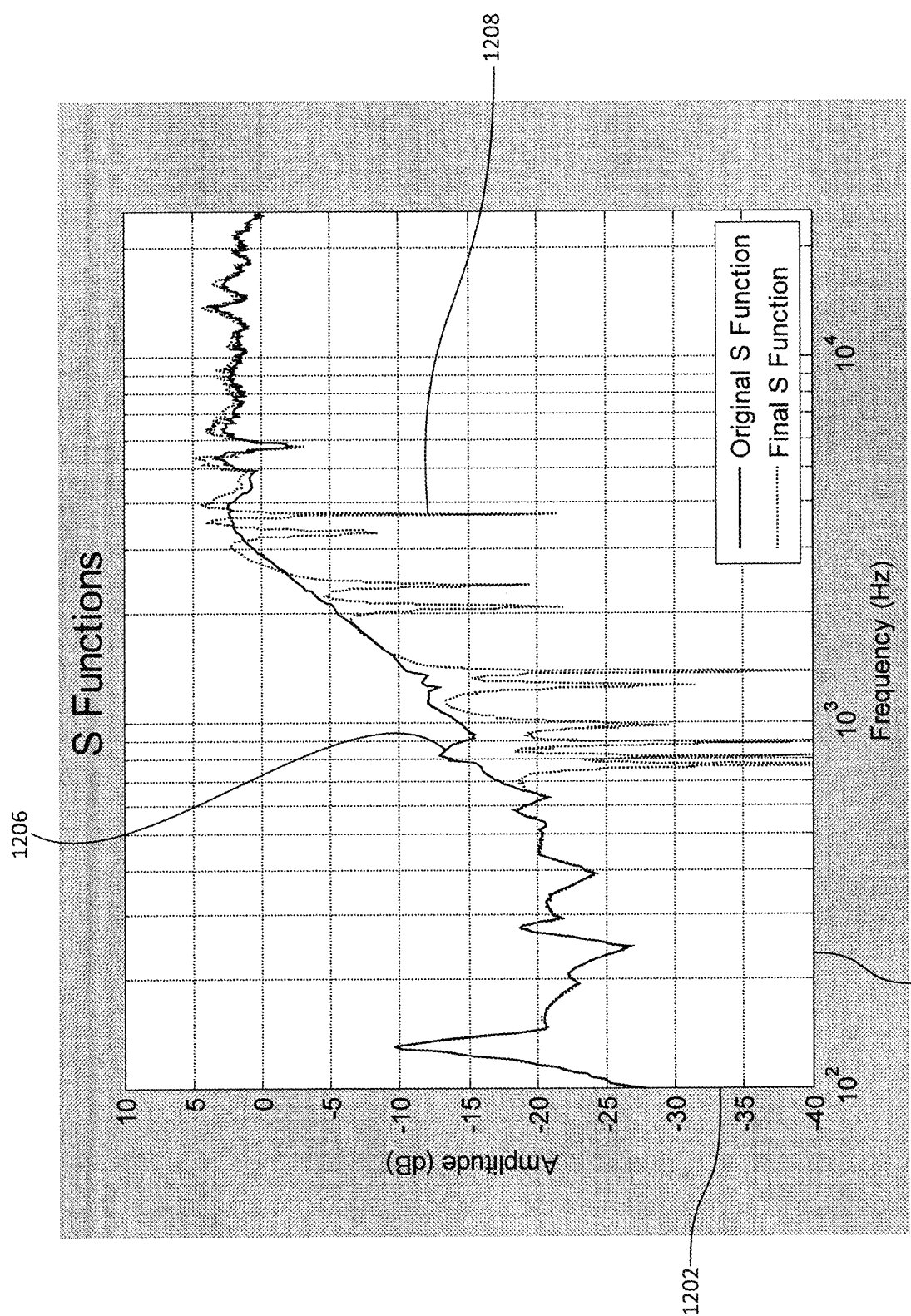

FIGS. 11 and 12 are S-function plots showing vibration-attenuation results obtained using the 10 PMDA filters. In both FIGS. 11 and 12, horizontal axis 1200 represents frequency in Hz and vertical axis 1202 represents amplitude in dB. FIG. 11 includes a PMDA S-function ($S_F$) plot 1204 showing vibration attenuation at the different frequencies listed in Table 1. FIG. 12 includes an original S-function ($S_0$) plot 1206 and overall S-function ($S_0.S_F$) plot 1208. The vibration attenuation at different disc mode frequencies can be seen in plot 1208.

Figure 13:
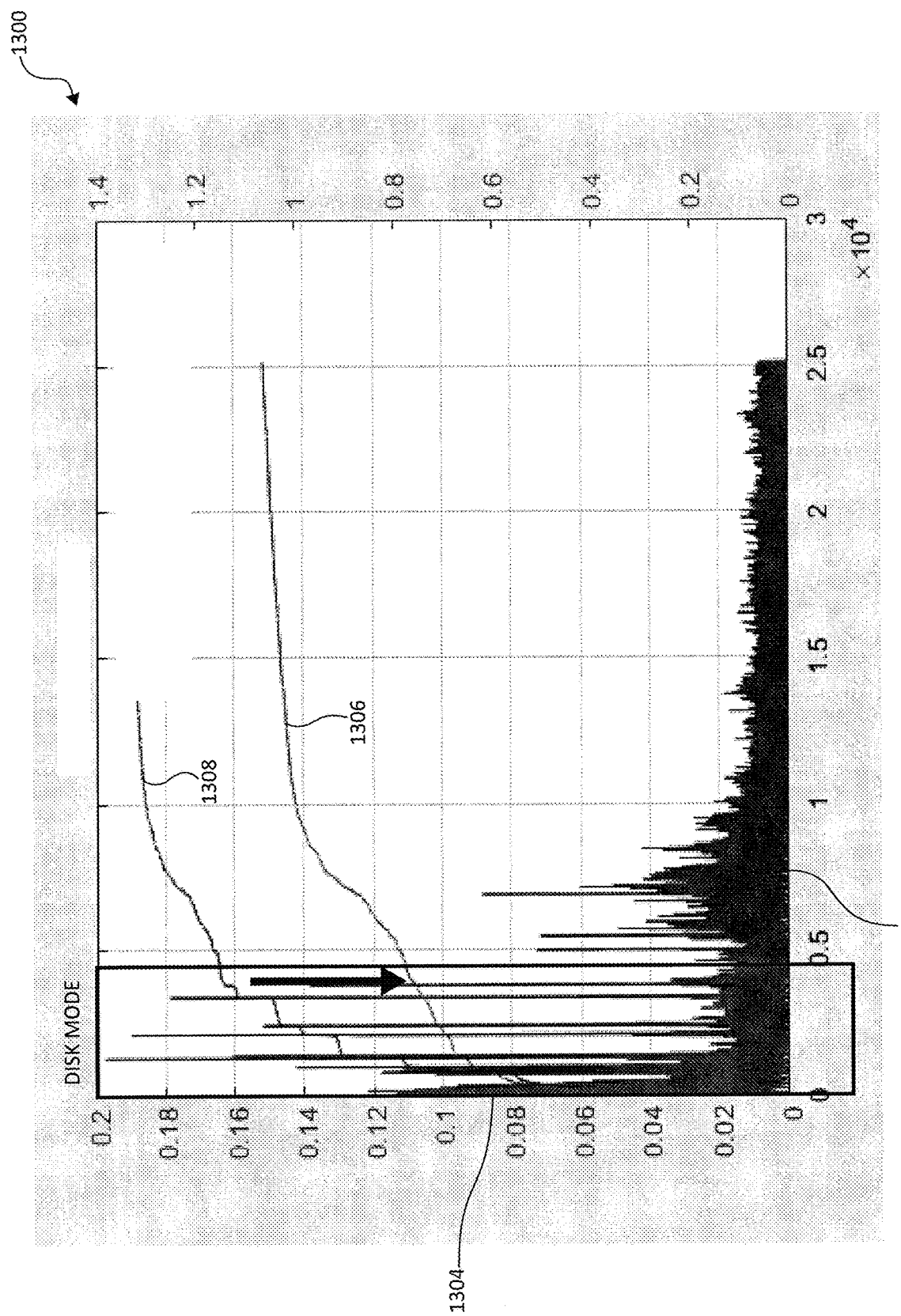

FIG. 13 is a graph 1300 that includes plots of NRRO error results obtained from one head of the HDD that includes the 10 PMDA filters. In graph 1300, horizontal axis 1302 represents frequency in Hz and vertical axis 1304 represents percentage of track pitch. Plot 1306 shows NRRO when the 10 PMDA filters are turned on in the HDD servo loop, and plot 1308 shows NRRO when the 10 PMDA filters are turned off in the HDD. By comparing plots 1306 and 1308, it is seen that there is a substantial reduction in NRRO due to the inclusion of the 10 PMDA filters (plot 1306).

The above-described embodiments relate to non-adaptive PMDA filters whose coefficients may be calculated at the time of manufacture based on, for example, observed disc mode frequencies. However, as noted earlier, data storage devices such as HDDs may also be subjected to frequency-varying disturbances such as disturbances induced from cabinet fan speed changes (e.g., a base fan harmonic frequency changes over different fan speeds). In embodiments of the disclosure, such vibration-inducing frequencies that can change from time to time during operation of the HDD are detected in real time, and coefficients of APDMA filters for attenuating vibrations at the detected frequencies are also calculated in real time. The time-varying frequencies may be detected using one or more PFDFs that are capable of learning the dominant time-varying frequencies that contribute to vibration. A PMDA regression model may be used in one embodiment to compute the APMDA coefficients in real time from the detected frequencies.

Figure 14:
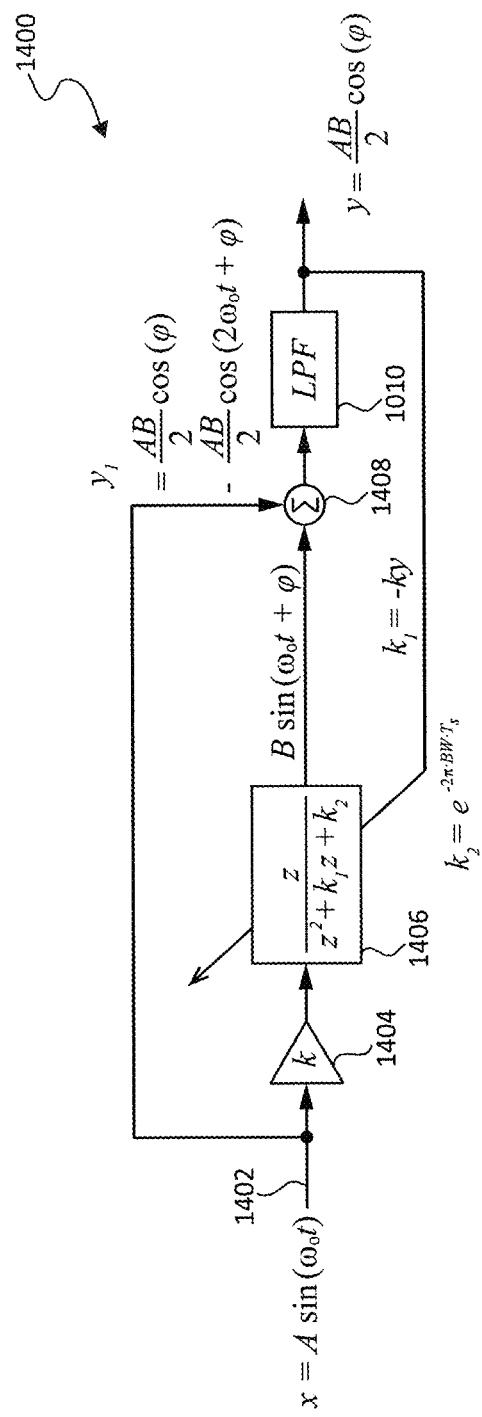
FIG. 14 is a simplified block diagram of a phase locked loop (PLL) in accordance with one embodiment.

In one embodiment, a phase locked loop (PLL) is employed as the PFDF. It should be noted that, in different embodiments, any suitable type of PFDF may be employed. FIG. 14 is a simplified block diagram of an example PLL 1400. PLL 1400 include an input 1402, a gain (k) 1404, a transfer function 1406, a multiplication node 1408, and a low-pass filter (LPF) 1010. PLL 1400 generates an output signal whose phase is related to a phase of an input signal. A sinusoidal wave $x = A\sin(\omega_0 t)$ is an input signal that is provided to gain 1404, which multiplies the input signal by constant k, thereby amplifying the input signal. The amplified input signal is provided to transfer function 1406, which responsively provides a transfer function output $B\sin(\omega_0 t + \varphi)$ in which $\varphi$ is a phase delay between the input signal and the transfer function output. The transfer function output and the input signal are provided to multiplication node 1008, which provides an output $y_1$ that is $$y_1 = A\sin(\omega_0 t) B \cos(\omega_0 t + \varphi) \quad \text{Equation 22}$$

From trigonometry, $$A\sin(\omega_0 t) B\sin(\omega_0 t + \varphi) = \frac{AB}{2}\cos(\varphi) - \frac{AB}{2}\cos(2\omega_0 t + \varphi) \quad \text{Equation 23}$$

The multiplication node output $y_1$ is provided to LPF 1010, which filters an unwanted portion of $y_1$ and provides a filtered output y. More specifically, LPF 1010 truncates $\cos(2\omega_0 t + \varphi)$ from $y_1$, and the DC residual $$y = \frac{AB}{2}\cos(\varphi),$$

which is the LPF 1010 output, is used for adaptation.
The adaptation of the PFDF is $$\dot{k}_1 = -ky \quad \text{Equation 24}$$

A PFDF is designed as $$\frac{1}{z + k_1 + k_2 z^{-1}}.$$

and therefore the PFDF becomes $$\frac{1}{z+k_1+k_2z^{-1}} = \frac{1}{e^{j\omega_0 T_s}+k_1+k_2 e^{-j\omega_0 T_s}} = \frac{1}{(1+k_2)\cos\omega_0 T_s + k_1 + j(1-k_2)\sin\omega_0 T_s}$$

Equation 25

The phase shift is:

$$\tan\varphi = -\frac{(1-k_2)\sin\omega_0 T_s}{(1+k_2)\cos\omega_0 T_s + k_1}$$

Equation 26

In Equation 26, $(1-k_2) \sin \omega_0 T_s$ and $(1+k_2) \cos \omega_0 T_s$ are constant over time. An inverted form of Equation 26 is $$\frac{1}{\tan\varphi} = -\frac{(1+k_2)\cos\omega_0 T_s + k_1}{(1-k_2)\sin\omega_0 T_s}$$

Equation 27

Differentiating both sides of Equation 27 to yields $$-\frac{1}{\tan^2\varphi} \times \frac{1}{\cos^2\varphi} \times \frac{d\varphi}{dk_1} = -\frac{1}{(1-k_2)\sin\omega_0 T_s}$$

Equation 28

$$\frac{d\varphi}{dk_1} = \frac{\sin^2\varphi}{(1-k_2)\sin\omega_0 T_s} > 0$$

Equation 29

From $$y = \frac{AB}{2}\cos(\varphi),$$

it follows that $$\dot{y} = -\frac{AB}{2}\sin\varphi\left(\frac{d\varphi}{dk_1}\right)\dot{k}_1$$

Equation 30

$\dot{k}_1$ is treated as a control input u, so that $u=\dot{k}_1$, and combing Equations 26 and 29 yields the following:

$$\dot{y} = -\frac{AB}{2}\frac{\sin^3\varphi}{(1-k_2)\sin\omega_0 T_s}u$$

Equation 31

Figure 15:
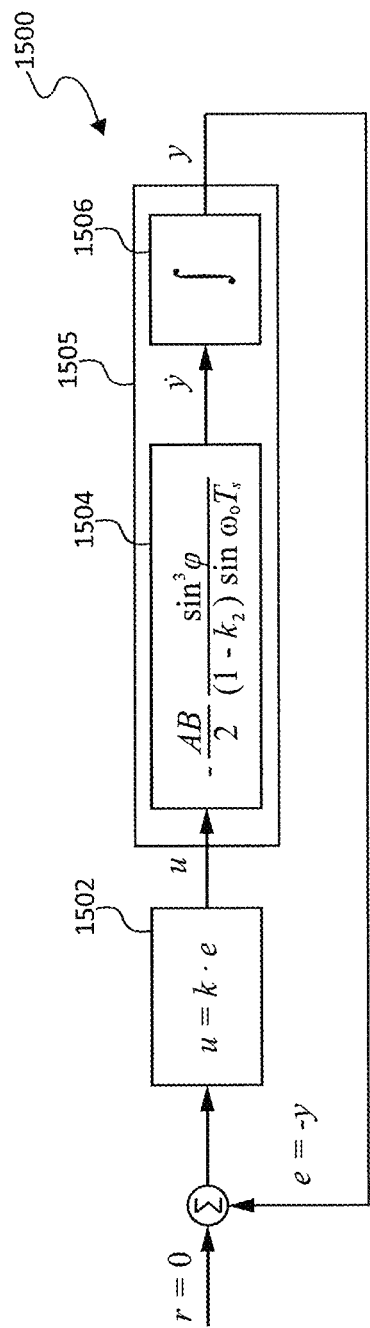
FIG. 15 is a simplified block diagram illustrating adaptive learning using a peak frequency detection filter (PFDF) in accordance with one embodiment.

FIG. 15 is a simplified block diagram illustrating adaptive learning 1500 using a PFDF. In the adaptive learning model 1500, block 1505 represents a plant including a first-order integrator 1506 with a gain of $$-\frac{AB}{2}\frac{\sin^3\varphi}{(1-k_2)\sin\omega_0 T_s},$$

which is denoted by a reference numeral 1502, and an output of y. The adaptation law of Equation 24 serves as a linear feedback or learning gain 1502 of a learning error e multiplied by a learning gain k.

By a proper design of learning gain 1502, the output of u=k·e, and $$\lim_{t\to\infty} e = -\lim_{t\to\infty}\frac{AB}{2}\cos(\varphi) = 0$$

Equation 32

Therefore $$\lim_{t\to\infty}\varphi = -\frac{\pi}{2}, \lim_{t\to\infty}\tan\varphi = \infty$$

Equation 33

From Equation 26 above, at steady-state, the denominator converges to zero, therefore $$\lim_{t\to\infty} k_1(t) = -(1+k_2)\cos\omega_0 T_s$$

Equation 34

The estimated frequency is:

$$f_0 = \frac{1}{2\pi T_s}\cos^{-1}\left(\frac{k_1}{k_2+1}\right)$$

Equation 35

Figure 16:
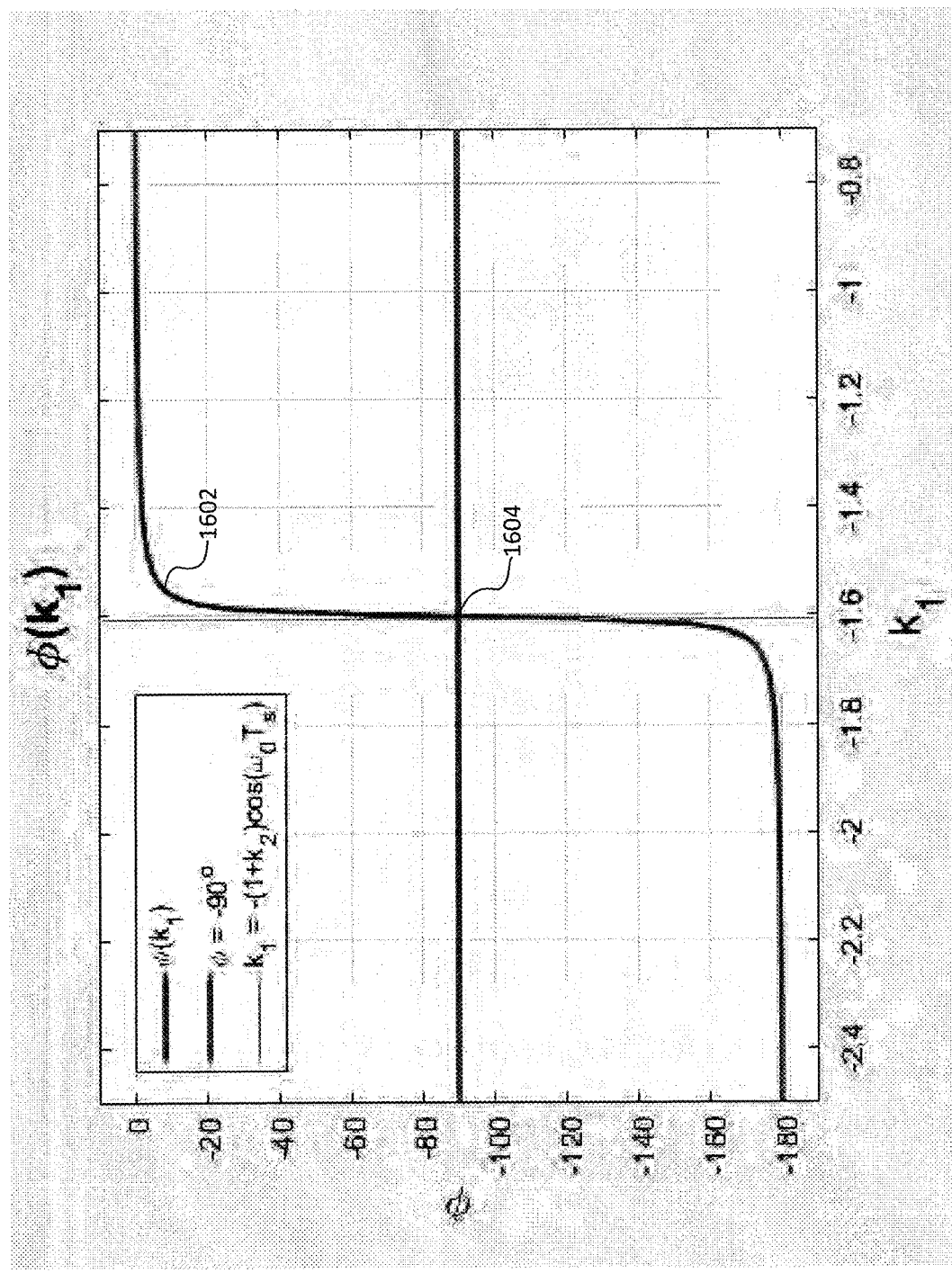
FIG. 16 is a graph illustrating adaptive learning in a PFDF in accordance with an embodiment of the disclosure.

FIG. 16 is a graph illustrating adaptive learning in a PFDF in accordance with one embodiment. Under a stable design of the learning gain, any initial ($k_1$, $\varphi$) 1602 will be attracted to a particular point (e.g., a critical point) 1604 [−(1+$k_2$)cos ($\omega_0 \cdot T_s$), −90°].

Figure 17:
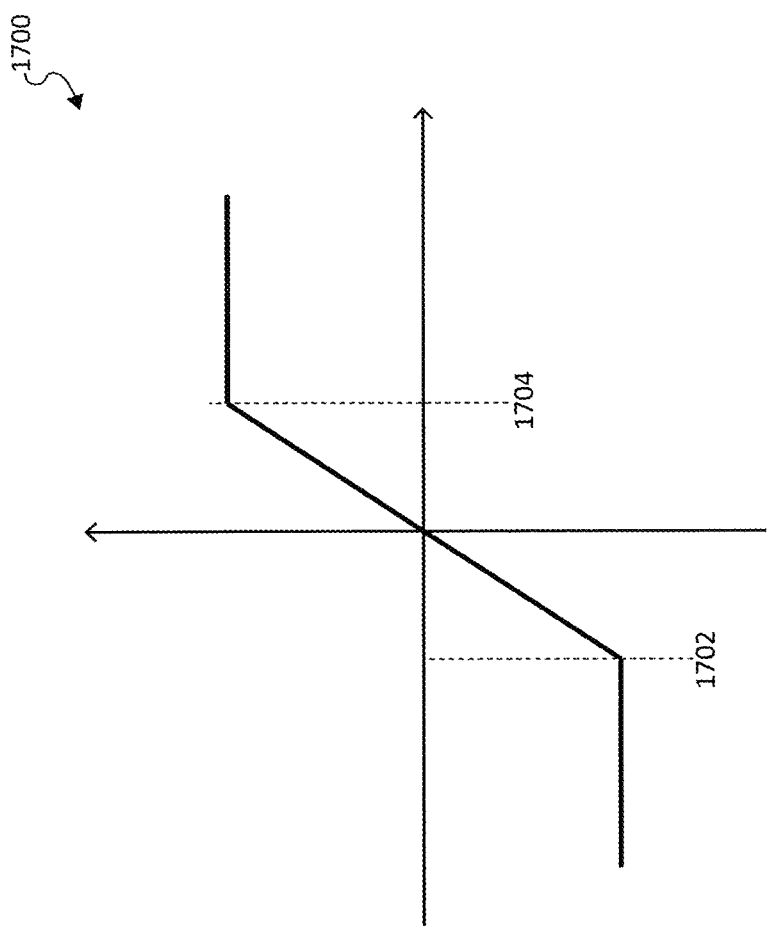
FIG. 17 is a graph illustrating adaptive gain using a saturation function.

FIG. 17 is a graph 1700 illustrating adaptive gain using a saturation function. Here, the adaptation gain is replaced by a saturation function. When a saturation function error is smaller than a low threshold 1702, a low gain is applied, and when the error is larger than a high threshold 1704, a high gain is applied. A linear gain from low gain to high gain is applied when the error is in between the low and high thresholds 1702 and 1704.

After the PFDF (e.g., the PLL) is designed in a manner described above, PFDF code (e.g., PLL code) is saved in any suitable memory in, for example, the HDD that includes the servo loop. When executed by a processor in the HDD, the servo code implements the PFDF (e.g., the PLL).

Figure 18:
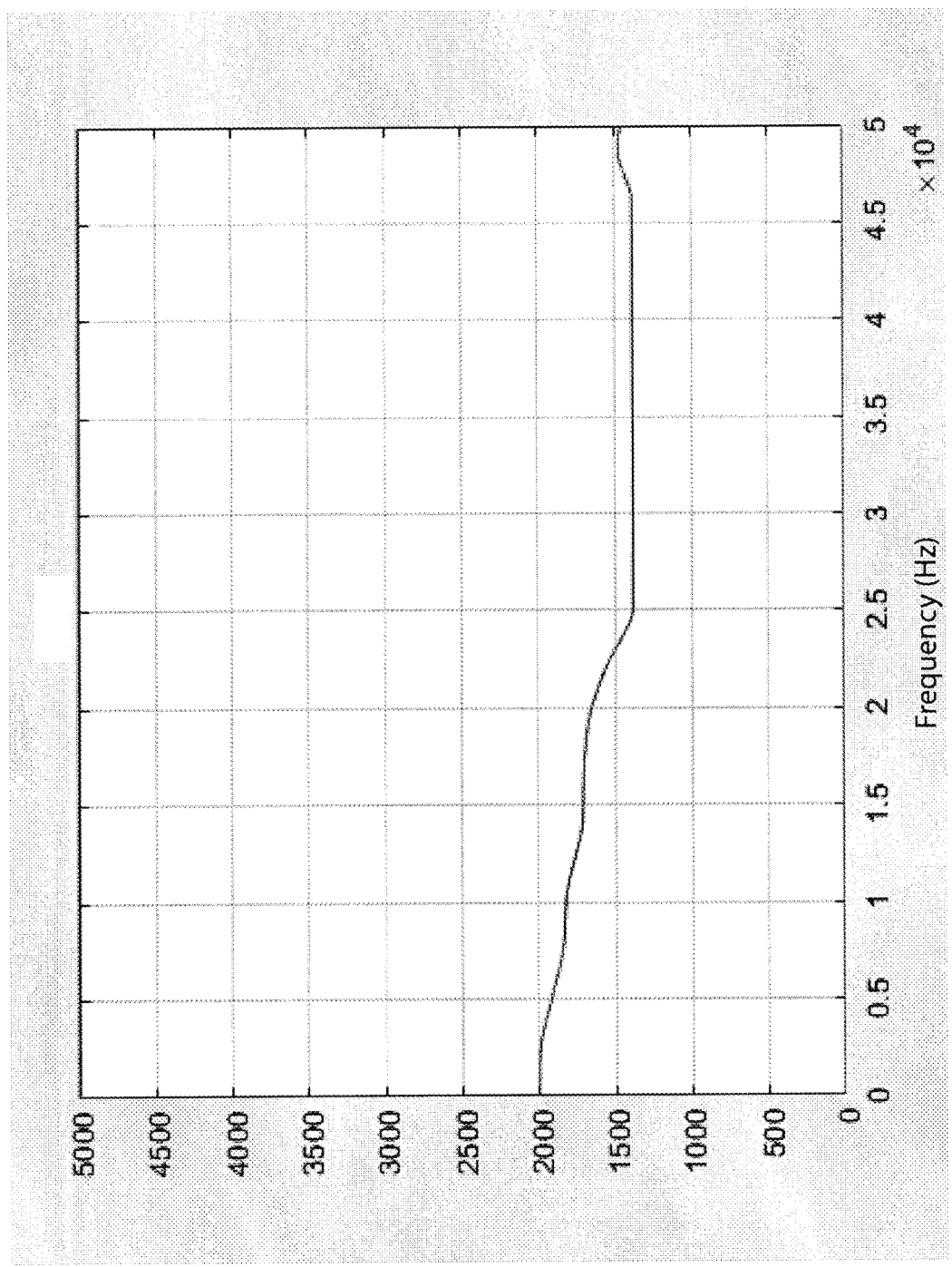
FIG. 18 is a graph illustrating fan harmonics detected by a PLL.

As noted earlier, in some applications (e.g., in data centers), a number of HDDs may be closely packed together in an enclosure, and the HDDs may be cooled by one or more fans in the enclosure. PLLs of the type described above may be used to detect fan harmonics. FIG. 18 is a graph illustrating fan harmonics detected by an example PLL. In FIG. 18, the starting frequency is 2000 Hz, and it gradually converges to a target disc mode frequency at 1500 Hz.

As noted above, linear regression may be used to determine APMDA coefficients. Linear regression may be performed after the real-time estimation of one or more frequencies to be attenuated using Equation 35. Equation 36 below is the steady-state version of Equation 34.

$$k_1 = -(1+k_2)\cos\omega_0 T_s$$

Equation 36

Figure 19:
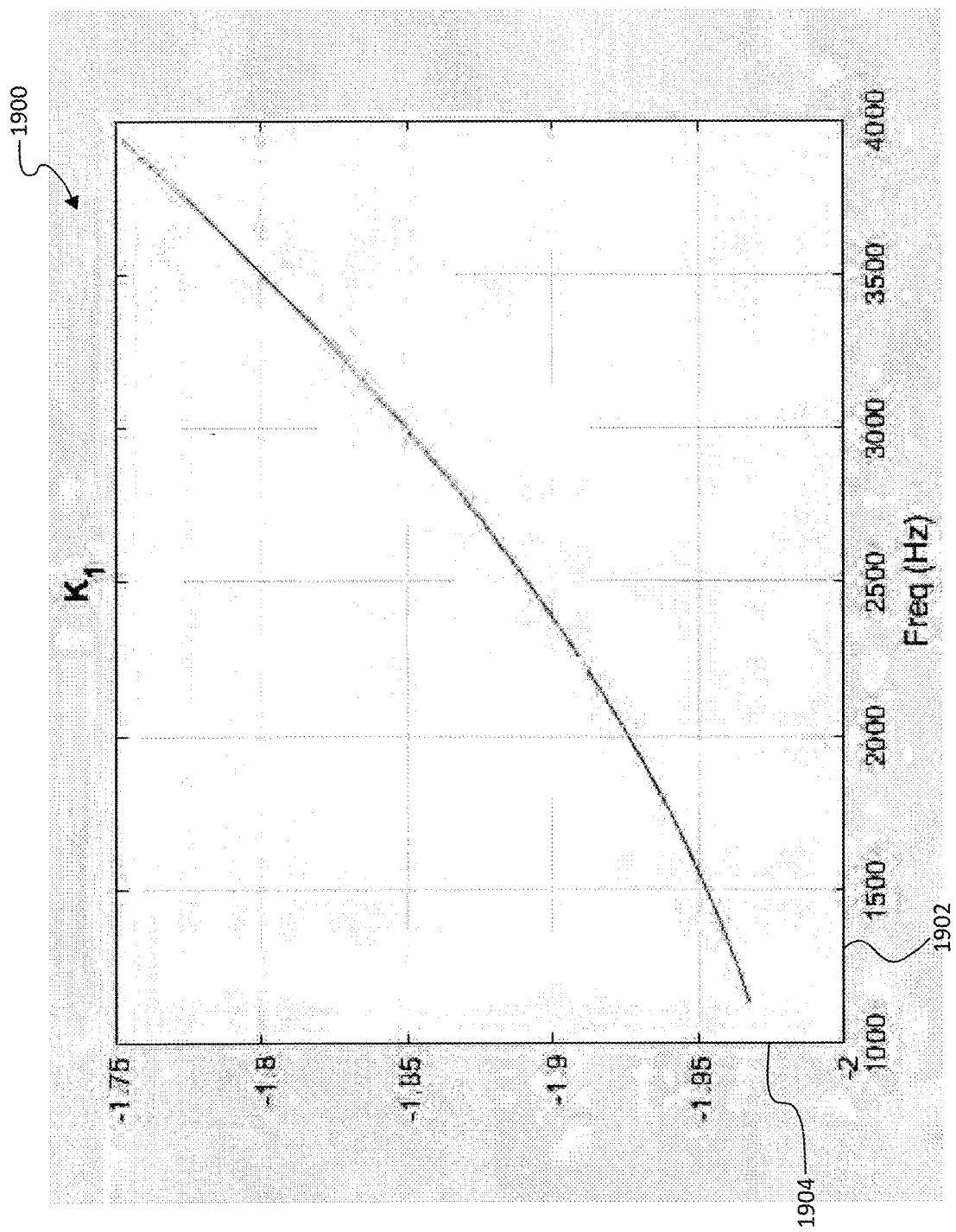
FIGS. 19 and 20 are graphs illustrating linear regression from a detected frequency to APMDA coefficients.

Equation 35 provides a relationship between frequency $f_0$ and $f_1$. FIG. 19 is a graph showing $k_1$ values at different frequencies. In FIG. 19, horizontal axis 1902 represents frequency in Hz and vertical represents $k_1$ values. FIG. 19 shows that $k_1$ can be computed for different frequencies. From PMDA filters over various design frequencies, $$F(z) = \frac{b_0 + b_1 z^{-1} + b_2 z^{-2}}{1 + a_1 z^{-1} + a_2 z^{-2}} \quad \text{Equaton 37}$$

where $a_0$, $a_1$, $b_0$, $b_1$ and $b_2$ are a set of PMDA coefficients over $f_0$.

Figure 20:
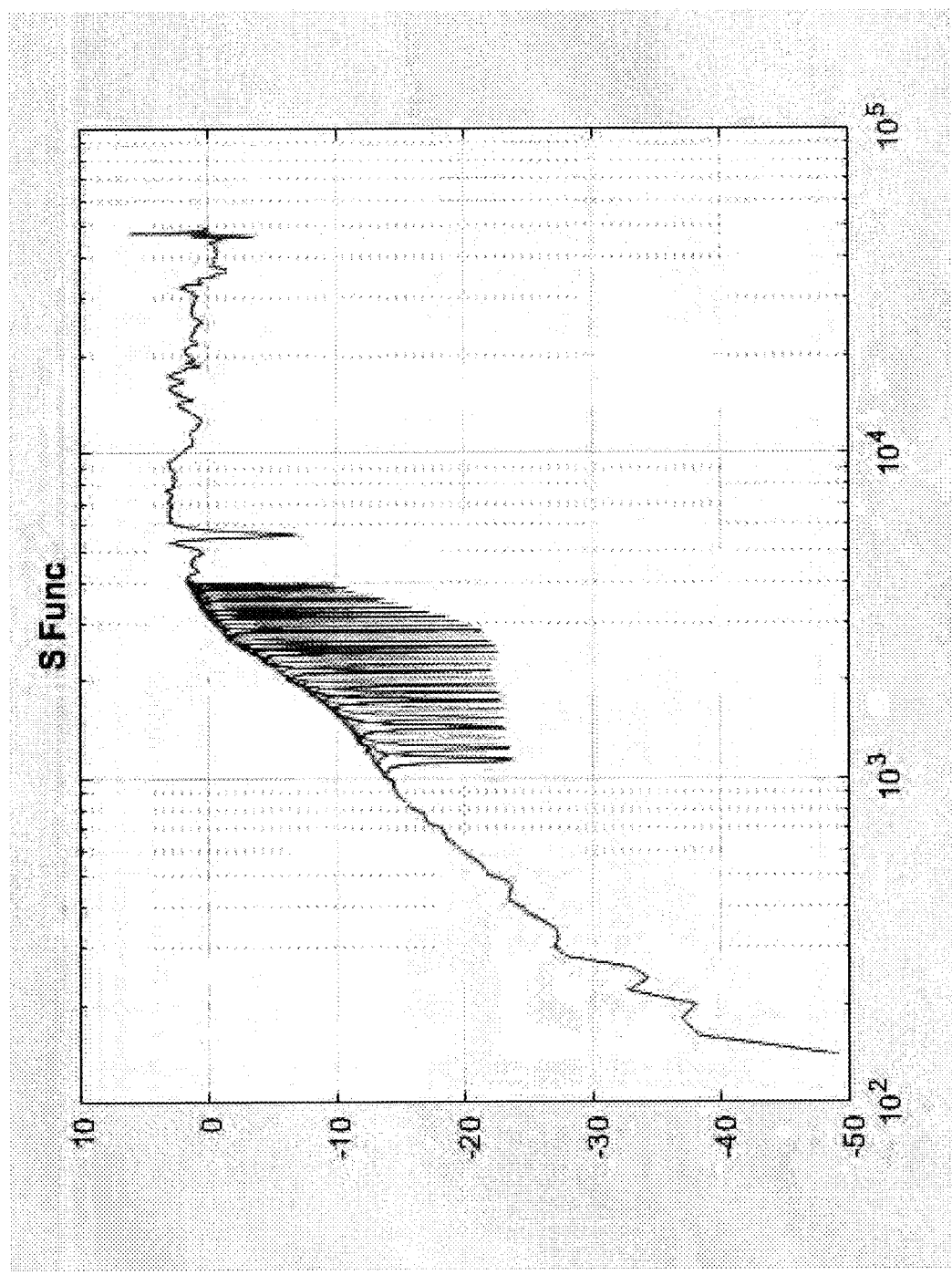

Eliminating frequency $f_0$ yields a relation from $k_1$ to PMDA coefficients $a_0$, $a_1$, $b_0$, $b_1$, $b_2$. FIG. 20 is a plot showing an S-function by varying PMDA frequency from 1 KHz to 4 KHz.

Linear combiner regression $$y = \theta^T x \quad \text{Equation 38}$$

where $$\theta = \begin{bmatrix} \theta_0 \\ \theta_1 \\ \theta_2 \end{bmatrix}, x = \begin{bmatrix} 1 \\ k_1 \\ k_1^2 \end{bmatrix}$$

Figure 21:
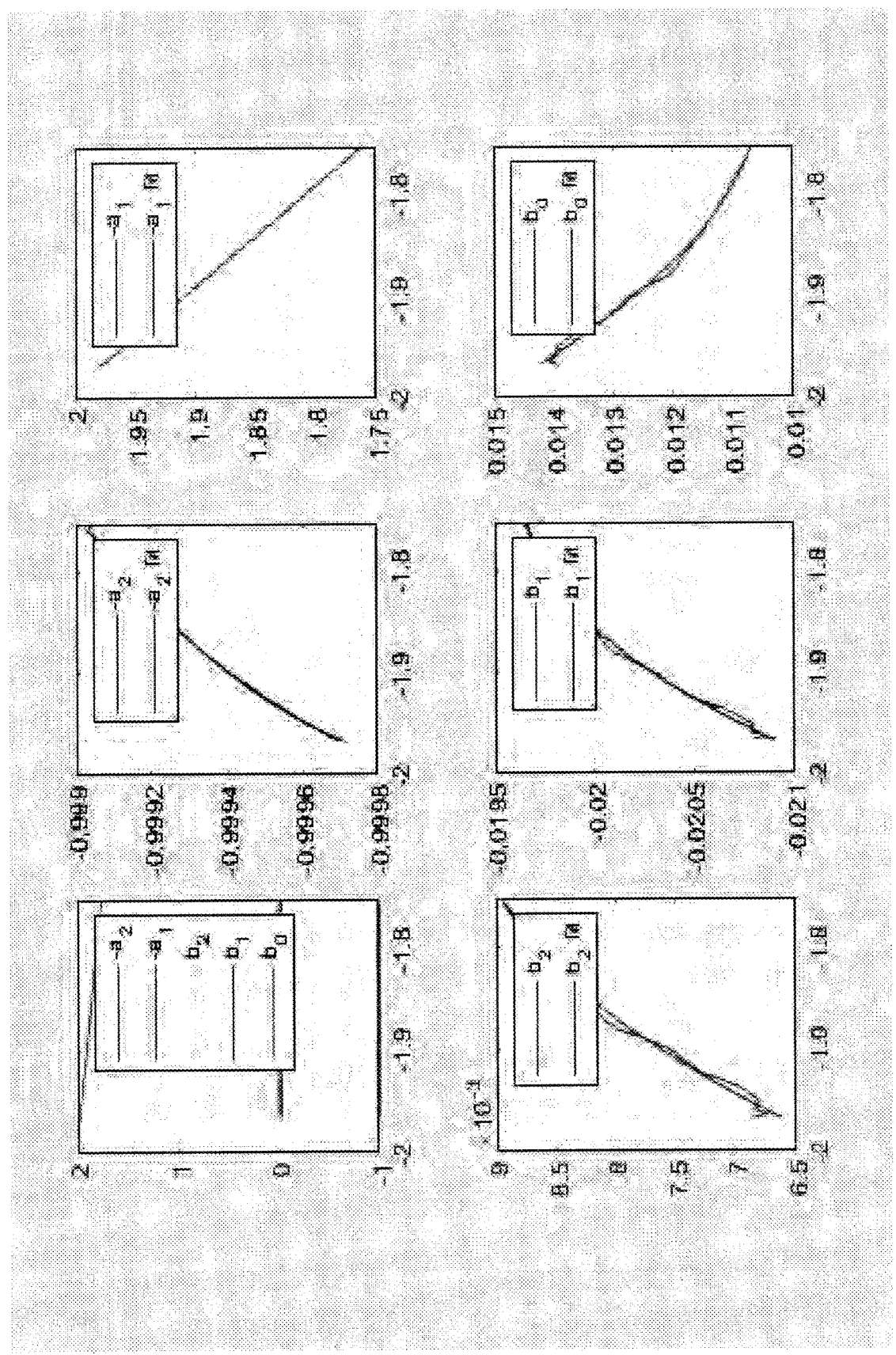
FIG. 21 is a simplified block diagram illustrating the calculation of APMDA coefficients.

FIG. 21 shows linear regression of the 5 coefficients $a_0$, $a_1$, $b_0$, $b_1$, $b_2$. Liner regression involves curve fitting of actual data into a second order polynomial. Curve fitting by linear regression allows for carrying out computations for points on the curve other than the actual data points.

Figure 22:
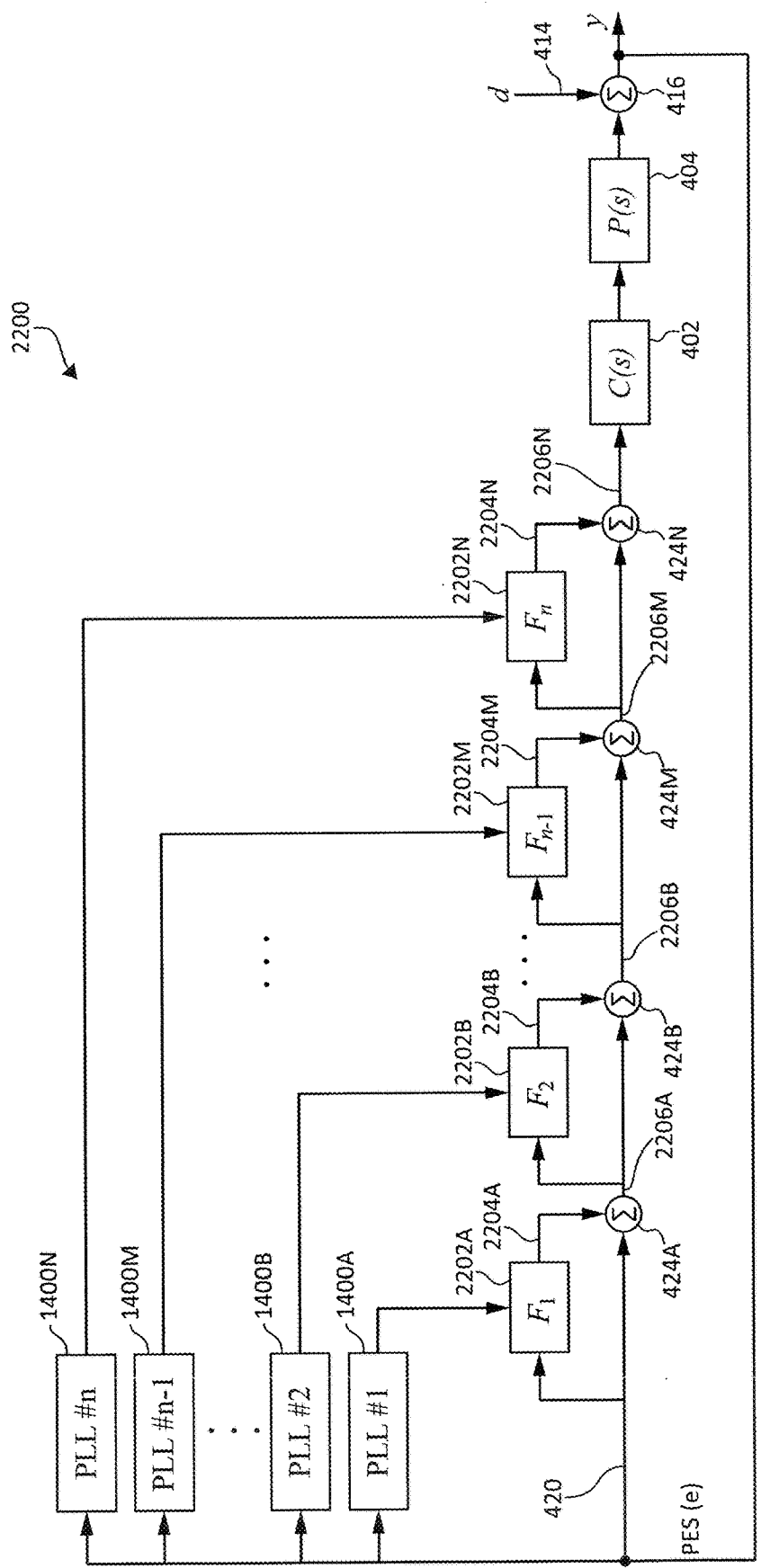
FIG. 22 is a simplified block diagram of a servo loop including multiple PLLs and APDMA filters.

FIG. 22 illustrates a servo loop 2200 that includes PLLs 1400A-1400N coupled to respective ones of APMDA filters 2202A-2202N. Each different one of the different PLLs 1400A-1400N detects a different frequency in real time, and corresponding ones of the APMDA filters 2202A-2202N attenuate the different detected frequencies. For example, PLL 1400A detects a first frequency from a PES (e.g., raw PES 420) and provides the first frequency to APMDA filter 2202A, which responsively produces a first vibration-cancellation signal 2204A. Signal 2204A is provided to summing node 424A at which the raw PES 420 and the first vibration-cancellation signal 2204A are summed. The summing of signals 420 and 2204A results in a first refined PES 2206A. PLL 1400B detects a second frequency from the PES (e.g., raw PES 420) and provides the second frequency to APMDA filter 2202B, which responsively produces a second vibration-cancellation signal 2204B. Signal 2204A is provided to summing node 424B at which the first refined PES 2206A and the second vibration-cancellation signal 2204B are summed. The summing of signals 2206A and 2204B results in a second refined PES 2206B. A similar process is carried out in the remaining ones of the N PLLs and APMDA filters.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage drive having a servo loop for positioning a head over a disc, the servo loop comprising:
    a sensor, located in the head, configured to sense servo information located on the disc and produce a servo signal therefrom, the servo signal combined with a reference signal to produce a raw position error signal (PES);
    at least one phase-matching disturbance attenuation (PMDA) filter that receives the raw PES as an input and responsively outputs a vibration-cancellation signal, which, when combined with the raw PES, cancels vibration-induced disturbance from the raw PES, thereby producing a refined PES;
    a servo controller configured to receive the refined PES and to responsively produce a servo control signal; and
    an actuator configured to move the head in response to receiving the servo control signal.

2. The data storage drive of claim 1 and wherein the at least one PMDA filter comprises at least one non-adaptive PMDA filter having a phase response that corresponds to a closed loop phase response of the data storage drive, the at least one non-adaptive PMDA filter configured to produce the vibration-cancellation signal that cancels at least one resonance mode frequency of at least one component of the data storage drive present in the raw PES.

3. The data storage drive of claim 1 and wherein the servo loop further comprises at least one peak frequency detection filter that detects at least one frequency of a time-varying disturbance in the raw PES.

4. The data storage drive of claim 3 and wherein the at least one PMDA filter comprises at least one adaptive PMDA (APMDA) filter that is configured to produce the vibration-cancellation signal that cancels the time-varying disturbance, at the detected at least one frequency, from the raw PES.

5. The data storage drive of claim 4 and wherein the APMDA filter comprises a filter coefficient calculation component that is configured to calculate, in real-time, coefficients of the APMDA in response to receiving the detected at least one frequency from the peak frequency detection filter.

6. The data storage device of claim 5 and wherein the APMDA filter further comprises a signal filtering component that employs the real-time-calculated coefficients to produce the vibration-cancellation signal in response to receiving the raw PES.

7. The data storage device of claim 3 and wherein the peak frequency detection filter comprises a phase locked loop.

8. An apparatus comprising:
a servo loop configured to position a head over a disc;
a sensor, located in the head, configured to sense servo information located on the disc and produce a servo signal therefrom, the servo signal combined with a reference signal to produce the raw PES; and
at least one phase-matching disturbance attenuation (PMDA) filter, in the servo loop, that is configured to produce a vibration-cancellation signal that cancels vibration-induced disturbance in a raw position error signal (PES) in the servo loop.

9. The apparatus of claim 8 and wherein the servo loop further comprises:
a summing node configured to combine the vibration-cancellation signal with the raw PES such that a refined PES is produced;
a servo controller configured to receive the refined PES and to responsively produce a servo control signal; and
an actuator configured to move the head in response to receiving the servo control signal.

10. The apparatus of claim 9 and wherein the at least one PMDA filter comprises at least one non-adaptive PMDA filter having a phase response that corresponds to a closed loop phase response of the apparatus, the at least one non-adaptive PMDA filter configured to produce the vibration-cancellation signal that cancels at least one resonance mode frequency of at least one component of the apparatus present in the raw PES.

11. The apparatus of claim 9 and wherein the servo loop further comprises at least one peak frequency detection filter that detects at least one frequency of a time-varying disturbance in the raw PES.

12. The apparatus of claim 11 and wherein the at least one PMDA filter comprises at least one adaptive PMDA (APMDA) filter that is configured to produce the vibration-cancellation signal that cancels the time-varying disturbance, at the detected at least one frequency, from the raw PES.

13. The apparatus of claim 12 and wherein the APMDA filter comprises a filter coefficient calculation component that is configured to calculate, in real-time, coefficients of the APMDA in response to receiving the detected at least one frequency from the peak frequency detection filter.

14. The apparatus of claim 13 and wherein the APMDA filter further comprises a signal filtering component that employs the real-time-calculated coefficients to produce the vibration-cancellation signal in response to receiving the raw PES.

15. The apparatus of claim 11 and wherein the peak frequency detection filter comprises a phase locked loop.

16. A method carried out in a servo loop for positioning a head over a disc, the method comprising:
sensing, by the head, servo information located on the disc and producing a servo signal therefrom;
combining the servo signal with a reference signal to produce a raw position error signal (PES);
employing at least one phase-matching disturbance attenuation (PMDA) filter to produce a vibration-cancellation signal that cancels vibration-induced disturbance present in the raw PES.

17. The method of claim 16 and further comprising:
combining the vibration-cancellation signal with the raw PES such that a refined PES is produced; and
receiving, by a servo controller, the refined PES;
producing, by the servo controller, a servo control signal based on the refined PES; and
moving the head according to the servo control signal.

18. The method of claim 16 and wherein employing the at least one phase-matching disturbance attenuation (PMDA) filter to produce the vibration-cancellation signal comprises employing at least one non-adaptive PMDA filter having a phase response that corresponds to a closed loop phase response of a data storage drive that includes the servo loop, the at least one non-adaptive PMDA filter being capable of producing the vibration-cancellation signal that cancels at least one resonance mode frequency of at least one component of the data storage drive present in the raw PES.

19. The method of claim 16 and further comprising detecting, bay a peak frequency detection filter, at least one frequency of a time-varying disturbance in the raw PES.

20. The method of claim 19 and wherein employing the at least one PMDA filter comprises employing at least one adaptive PMDA (APMDA) filter that is capable of producing the vibration-cancellation signal that cancels the time-varying disturbance, at the detected at least one frequency, from the raw PES.

* * * * *